(12) United States Patent
Yasuda

(10) Patent No.: US 6,713,882 B2
(45) Date of Patent: Mar. 30, 2004

(54) RESIN SEALING APPARATUS AND RESIN SEALING METHOD

(75) Inventor: Naoya Yasuda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/091,303

(22) Filed: Mar. 6, 2002

(65) Prior Publication Data

US 2003/0052418 A1 Mar. 20, 2003

(30) Foreign Application Priority Data

Sep. 20, 2001 (JP) ........................................ 2001-287396

(51) Int. Cl.⁷ ............................................. H01L 23/28
(52) U.S. Cl. ...................... 257/787; 438/124; 438/127
(58) Field of Search .......................... 257/787; 438/124, 438/127

(56) References Cited

U.S. PATENT DOCUMENTS 6,081,978 A * 7/2000 Utsumi et al. .............. 29/25.01

FOREIGN PATENT DOCUMENTS

| JP | 63-16630 | 1/1988 |
| JP | 1-124226 | 5/1989 |
| JP | 4-348536 | 12/1992 |
| JP | 8-57906 | 3/1996 |
| JP | 2000-252311 | 9/2000 |

* cited by examiner

Primary Examiner—Luan Thai
(74) Attorney, Agent, or Firm—McDermott, Will & Emery

(57) ABSTRACT

The resin sealing apparatus includes a mold that has a main cavity into which a portion of a semiconductor device to be sealed with a resin is disposed. Furthermore, an external-shape regulating member is detachably accommodated in the main cavity of the mold to form a new cavity inside the main cavity.

4 Claims, 12 Drawing Sheets

RESIN SEALING APPARATUS AND RESIN SEALING METHOD

FIELD OF THE INVENTION

The present invention relates to a resin sealing apparatus and a resin sealing method that are used for sealing a desired portion of a semiconductor device with a resin at a stage of manufacturing the semiconductor device.

BACKGROUND OF THE INVENTION

Some semiconductor devices have a resin sealing on portions of a semiconductor chip mounted on a lead frame, and a connection portion between the semiconductor chip and the lead frame (hereinafter to be simply referred to as an inner bonding portion). As these semiconductor devices have the semiconductor chip and the inner bonding portion covered with a seal resin, it is possible to prevent the semiconductor chip and the inner bonding portion from being affected by disturbance of temperature, humidity, shock, and pressure.

FIG. 13A to FIG. 13D show a sequence of a conventional method of sealing a semiconductor device with a resin. According to this resin sealing method, a semiconductor chip 3 is first mounted on a die pad section 2 of a lead frame 1, as shown in FIG. 13A and FIG. 13B. Then, the inner lead of the lead frame 1 and the bonding pad of the semiconductor chip 3 are connected with a conductor like a gold line (inner bonding), and the lead frame 1 is set in a mold 4.

The mold 4 has an upper mold 4a and a lower mold 4b disposed such that they can be mutually opened and closed. Cavity structuring sections 4a1 and 4b1 are provided in the upper mold 4a and the lower mold 4b to face each other. The cavity structuring sections 4a1 and 4b1 are structured to form a cavity 5 that is large enough to accommodate the semiconductor chip 3 and the inner bonding portion in the cavity 5, when the upper mold 4a and the lower mold 4b are closed together. Accordingly, the die pad section 2 of the lead frame 1 mounted with the semiconductor chip 3 and the inner bonding portion are accommodated in the cavity 5, as shown in FIG. 13C. In this state, a molten resin is charged into the cavity 5, and is then cured. As a result, it is possible to manufacture a semiconductor device 7 having only a desired portion sealed with a seal resin 6.

According to the resin sealing method, the seal resin 6 of the semiconductor device 7 is formed in a shape that matches the shape of the cavity 5 provided on the mold 4. Therefore, when it is desired to change external sizes like thickness, width and length of the sealed resin 6 or an external shape of the sealed resin 6 in the semiconductor device 7, it is not possible to achieve this unless the shape of the cavity of the mold 4 is changed. For example, when it is desired to manufacture a semiconductor device 7' having a large thickness of a sealed resin 6' as shown in FIG. 14A, it is necessary to prepare a new mold 4' having a cavity 5' that matches the thickness of the sealed resin 6' as shown in FIG. 14B, even if other structures remain unchanged.

In order to manufacture the new mold 4', it is necessary to prepare a design of this mold, and then manufacture this mold, which takes time. This makes it difficult to promptly meet the requirement. Further, the cost of manufacturing the new mold 4' leads to an increase in the cost of manufacturing the semiconductor device. Furthermore, in the case of continuously manufacturing semiconductor devices having different external sizes like thickness, width and length of sealed resins or different external shapes of sealed resins, it is necessary to replace the mold each time of manufacturing a different semiconductor device. Consequently, this work interrupts the improvement in production efficiency.

SUMMARY OF THE INVENTION

It is an object of this invention to provide a resin sealing apparatus and a resin sealing method capable of promptly meeting the requirement when it is necessary to change external sizes or an external shape of a sealed resin, capable of reducing the cost of manufacturing a semiconductor device, and capable of improving production efficiency.

The resin sealing apparatus according to one aspect of the present invention comprises a mold having a main cavity in which a portion of a semiconductor device to be sealed with a resin is disposed; and an external-shape regulating member detachably accommodated in the main cavity of the mold, for forming a new cavity within the main cavity.

According to the above-mentioned aspect, it is possible to change external sizes or an external shape of the sealed resin, by accommodating the external-shape regulating member in the main cavity of the mold.

The resin sealing apparatus according to another aspect of the present invention comprises a pair of molds having a main cavity there between in which a portion of a semiconductor device to be sealed with a resin is disposed; and a spacer member detachably disposed between the pair of molds, for forming a new cavity between the pair of molds.

According to the above-mentioned aspect, it is possible to change external sizes and an external shape of a sealed resin, by disposing the spacer member between the pair of molds.

The resin sealing apparatus according to still another aspect of the present invention comprises a mold having a main cavity in which a portion of a semiconductor device to be sealed with a resin is disposed; and an external-shape regulating member disposed such that it can proceed to and recede from the main cavity of the mold, thereby to form a new cavity within the main cavity when the external-shape regulating member has proceeded.

According to above-mentioned aspect, it is possible to change external sizes and an external shape of a sealed resin, by making the external-shape regulating member proceed to the main cavity.

The resin sealing apparatus according to still another aspect of the present invention comprises a pair of molds for forming a main cavity between the molds, wherein a molten resin is charged into the main cavity and the molten resin is cured in a status that a portion of a semiconductor device to be sealed with the resin is disposed in the main cavity of the molds, wherein a portion of the mold that constitutes a peripheral wall of the main cavity is provided such that the height of this portion can be changed.

According to the above-mentioned aspect, it is possible to change external sizes and an external shape of a sealed resin, by changing the height of the portion of the mold that constitutes the peripheral wall of the main cavity.

The resin sealing method according to still another aspect of the present invention comprises selecting whether an external-shape regulating member for forming a new cavity is to be positioned inside a main cavity of a mold in advance or not, in accordance with a semiconductor device to be manufactured; disposing a portion of the semiconductor device to be sealed with a resin in the main cavity of the mold or the new cavity; and charging a molten resin into the main cavity of the mold or the new cavity, and curing the molten resin.

According to the above-mentioned aspect, it is possible to change external sizes and an external shape of a sealed resin by selecting whether the external-shape regulating member is to be accommodated in the main cavity of the mold or not.

The resin sealing method according to still another aspect of the present invention comprises selecting a external-shape regulating member that is to be positioned in a main cavity of a mold from among a plurality of kinds of external-shape regulating members in accordance with a semiconductor device to be manufactured, and forming a new cavity in the main cavity of the mold with the selected external-shape regulating member; disposing a portion of the semiconductor device to be sealed with a resin in the new cavity; and charging a molten resin into the new cavity, and curing the molten resin.

According to the above-mentioned aspect, it is possible to change external sizes and an external shape of a sealed resin depending on a kind of an external-shape regulating member that is accommodated in the main cavity of the mold.

The resin sealing method according to still another aspect of the present invention comprises selecting whether or not a spacer member for forming a new cavity is to be disposed in advance between a pair of molds that form a main cavity, in accordance with a semiconductor device to be manufactured; disposing a portion of the semiconductor device to be sealed with a resin in the main cavity of the mold or the new cavity; and charging a molten resin into the main cavity of the mold or the new cavity, and curing the molten resin.

According to the above-mentioned aspect, it is possible to change external sizes and an external shape of a sealed resin by selecting whether the spacer member is to be disposed between the pair of molds or not.

The resin sealing method according to still another aspect of the present invention comprises selecting a spacer member that is to be disposed between a pair of molds from among a plurality of kinds of spacer members in accordance with a semiconductor device to be manufactured, and forming a new cavity between the pair of molds with the selected spacer member; disposing a portion of the semiconductor device to be sealed with a resin in the new cavity; and charging a molten resin into the new cavity, and curing the molten resin.

According to the above-mentioned aspect, it is possible to change external sizes and an external shape of a sealed resin depending on a kind of a spacer member that is disposed between the pair of molds.

The resin sealing method according to still another aspect of the present invention comprises applying a mold having a portion that constitutes a peripheral wall of a main cavity of which height can be adjusted, and adjusting the height of the portion of the mold that constitutes the peripheral wall of the main cavity in the mold, in accordance with a semiconductor device to be manufactured; disposing a portion of the semiconductor device to be sealed with a resin into the new cavity; and charging a molten resin into the new cavity, and curing the molten resin.

According to the above-mentioned aspect, it is possible to change external sizes and an external shape of a sealed resin by adjusting the height of the portion of the mold.

Other objects and features of this invention will become apparent from the following description with reference to the accompanying drawings.

BRIEF DESCRIPTION OF THE DRAWINGS

FIG. 1A to FIG. 1D show a resin sealing apparatus according to a first embodiment of the present invention, in which FIG. 1A shows a cross-sectional side view of a mold in a status that an external-shape regulating member is not accommodated in a main cavity, FIG. 1B shows a cross-sectional side view of a semiconductor device sealed with a resin by the resin sealing apparatus shown in FIG. 1A, FIG. 1C shows a cross-sectional side view of a mold in a status that an external-shape regulating member is accommodated in a main cavity, and FIG. 1D shows a cross-sectional side view of a semiconductor device sealed with a resin by the resin sealing apparatus shown in FIG. 1C;

FIG. 4A and FIG. 4B show a resin sealing apparatus according to a second embodiment of the present invention, in which FIG. 4A shows a cross-sectional side view of a mold in a status that an external-shape regulating member having a small plate thickness is accommodated in a main cavity, and FIG. 4B shows a cross-sectional side view of a mold in a status that an external-shape regulating member having a large plate thickness is accommodated in a main cavity;

FIG. 5A to FIG. 5C show a resin sealing apparatus according to a third embodiment of the present invention, in which FIG. 5A shows a cross-sectional side view showing a status that a spacer member is not disposed between a pair of molds, FIG. 5B shows a cross-sectional side view showing a status that a spacer member having a small plate thickness is disposed between a pair of molds, and FIG. 5C shows a cross-sectional side view showing a status that a spacer member having a large plate thickness is disposed between a pair of molds;

FIG. 6A and FIG. 6B show a resin sealing apparatus according to a fourth embodiment of the present invention, in which FIG. 6A shows a cross-sectional side view of a mold in a status that an external-shape regulating member is receded, and FIG. 6B shows a cross-sectional side view of a mold in a status that an external-shape regulating member is proceeded;

FIG. 10A and FIG. 10B show a resin sealing apparatus according to a fifth embodiment of the present invention, in which FIG. 10A shows a cross-sectional side view of a mold in a status that a portion of a mold that constitutes a peripheral wall of a main cavity is contracted, and FIG. 10B shows a cross-sectional side view of a mold in a status that a portion of a mold that constitutes a peripheral wall of a main cavity is expanded;

FIG. 11A and FIG. 11B show a resin sealing apparatus according to a sixth embodiment of the present invention, in which FIG. 11A shows a cross-sectional side view of a mold in a status that a portion of a mold that constitutes a peripheral wall of a main cavity is receded, and FIG. 11B shows a cross-sectional side view of a mold in a status that a portion of a mold that constitutes a peripheral wall of a main cavity is proceeded;

FIG. 12A and FIG. 12B show a resin sealing apparatus according to a seventh embodiment of the present invention, in which FIG. 12A shows a cross-sectional side view of a mold in a receding status of a lifting member, and FIG. 12B shows a cross-sectional side view of a mold in a proceeding status of a lifting member;

FIG. 13A to FIG. 13D show steps of a conventional resin sealing method, in which FIG. 13A shows a cross-sectional side view of a lead frame, FIG. 13B shows a cross-sectional side view showing a status that the lead frame shown in FIG. 13A is disposed in a cavity of a mold, FIG. 13C shows a cross-sectional side view showing a status that a molten resin is filled in the mold shown in FIG. 13B, and FIG. 13D shows a cross-sectional side view of a semiconductor device in a status that a lead frame sealed with a resin is released from the mold;

DETAILED DESCRIPTION

Embodiments of the resin sealing apparatus and the resin sealing method relating to the present invention will be explained in detail below with reference to the accompanying drawings.

Figure 1A:
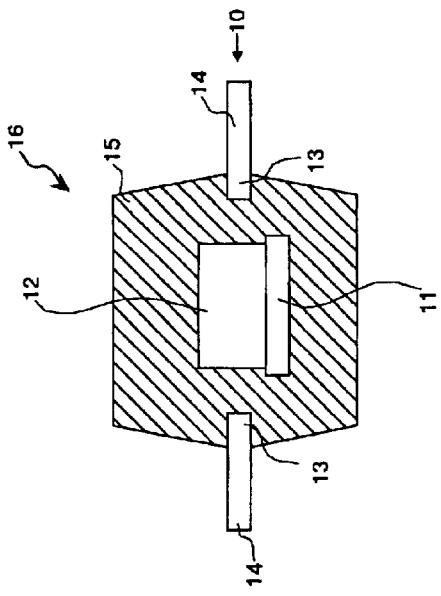
Figure 1B:
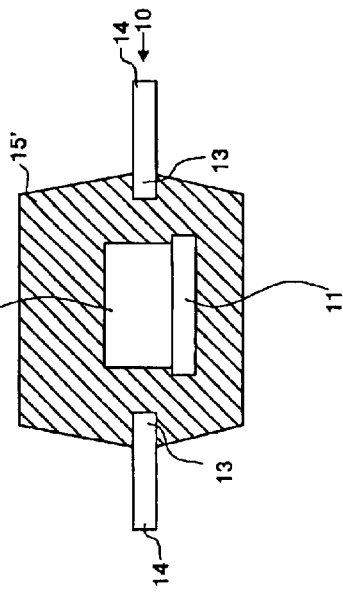
Figure 1C:
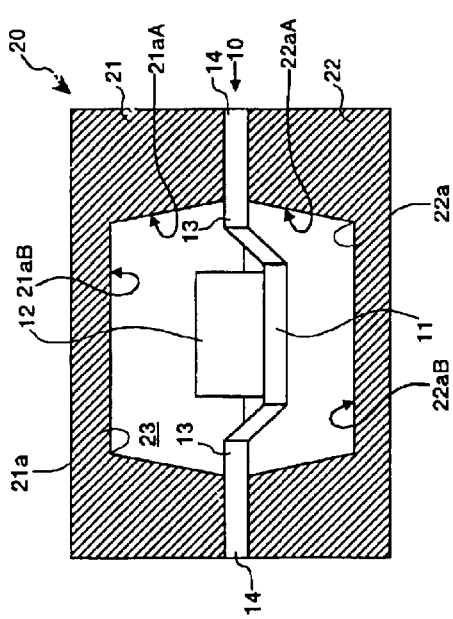
Figure 1D:
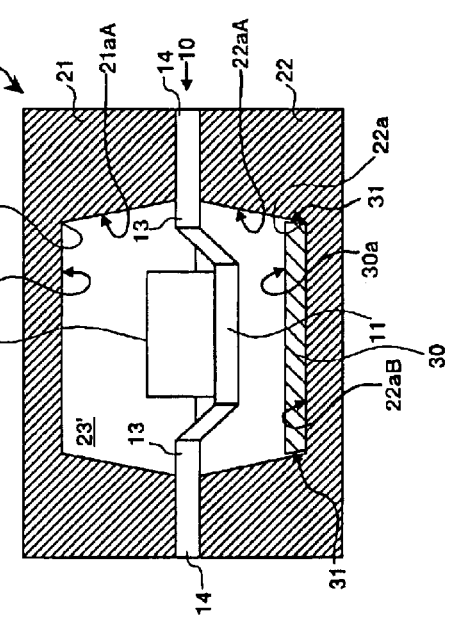

FIG. 1A to FIG. 1D are diagrams showing a structure of a resin sealing apparatus according to a first embodiment of the present invention. As shown in FIG. 1B and FIG. 1D, the resin sealing apparatus of the first embodiment is for manufacturing semiconductor devices 16 and 16' such as an SOP (small outline package) and a TSOP (thin small outline package). The resin sealing apparatus seals a semiconductor chip 12 mounted on a die pad section 11 of a lead frame 10 and a connection portion between the semiconductor chip 12 and an inner lead 13 of the lead frame 10 (hereinafter to be simply referred to as an inner bonding portion), with seal resins 15 and 15' to have mutually different thicknesses. Further, the resin sealing apparatus extends an outer lead 14 of the lead frame 10 to the outside of the sealed resins 15 and 15' respectively. The resin sealing apparatus of the first embodiment comprises a mold 20 and an external-shape regulating member 30.

The mold 20 consists of an upper mold 21 and a lower mold 22 disposed such that they can be opened or closed together. The upper mold 21 and the lower mold 22 are provided with cavity structuring sections 21a and 22a respectively at mutually opposite positions or at one position. The cavity structuring sections 21a and 22a are the portions that constitute a main cavity 23 large enough to accommodate the die pad section 11 on which the semiconductor chip 12 is mounted, the inner lead 13, and the inner bonding portion, on the lead frame 10, when the upper mold 21 and the lower mold 22 are closed together. In the first embodiment, peripheral inner-wall surfaces 21aA and 22aA that correspond to peripheral walls of the cavity structuring sections 21a and 22a are provided with release slopes respectively, by taking a mold release into consideration.

The external-shape regulating member 30 is detachably accommodated in the cavity structuring section 22a of the lower mold 22, and is structured in a plate shape having a constant thickness. This external-shape regulating member 30 has sizes to cover substantially the whole area of a bottom inner-wall surface 22aB in the cavity structuring section 22a, when the external-shape regulating member 30 has been accommodated in the cavity structuring section 22a of the lower mold 22. Peripheral end surfaces 31 of the external-shape regulating member 30 that face the peripheral inner-wall surface 22aA of the cavity structuring section 22a are provided with slopes corresponding to the release slope respectively.

For carrying out a resin sealing in the resin sealing apparatus having the structure, it is first decided whether or not the external-shape regulating member 30 is to be accommodated in the main cavity 23 of the mold 20 in according with the thickness of the sealed resins 15 and 15' of the semiconductor devices 16 and 16' to be manufactured respectively.

Namely, in the case of manufacturing the semiconductor device 16 having a large thickness of the sealed resin 15, the lead frame 10 is disposed in the main cavity 23 in a status that the external-shape regulating member 30 has been removed from the main cavity 23, as shown in FIG. 1A. In this state, the whole main cavity 23 that is formed between the upper mold 21 and the lower mold 22 becomes the capacity to be charged with a molten resin. Accordingly, when the molten resin is charged in this state and the molten resin is cured thereafter, it becomes possible to manufacture the semiconductor device 16 having a large thickness of the sealed resin 15, as shown in FIG. 1B.

On the other hand, in the case of manufacturing the semiconductor device 16' having a smaller thickness of the sealed resin 15' than that of the sealed resin of the semiconductor device 16 shown in FIG. 1B, the external-shape regulating member 30 is accommodated in the cavity structuring section 22a of the lower mold 22 in advance, as shown in FIG. 1C. In this state, a new cavity 23' is formed at a portion above an upper surface 30a of the external-shape regulating member 30, inside the main cavity 23 that is formed between the upper mold 21 and the lower mold 22. Therefore, only the new cavity 23' becomes the capacity to be charged with the molten resin. Accordingly, when the molten resin is charged in this state and the molten resin is cured thereafter, it becomes possible to manufacture the semiconductor device 16' having a relatively small thickness of the sealed resin 15', as shown in FIG. 1D.

As explained, according to the resin sealing apparatus, it is possible to change the thickness of the sealed resins 15 and 15' by either accommodating or not accommodating the external-shape regulating member 30 in the main cavity 23 of the mold. Therefore, it is not necessary to design and manufacture a new mold 20 following a change in the thickness of the sealed resins 15 and 15'. Consequently, it becomes possible to promptly respond to the requirement, and it is also possible to lower the cost of manufacturing the semiconductors 16 and 16'. Further, in the case of continuously manufacturing the semiconductor devices 16 and 16' having mutually different thicknesses in the sealed resins 15 and 15', it is not necessary to replace the mold 20 in the preparation work. Further, as a slope is formed on the peripheral end surfaces 31 of the external-shape regulating member 30 along the peripheral inner-wall surface 22aA of the main cavity 23, it becomes easy to mount and dismount the external-shape regulating member 30 onto/from the main cavity 23. As a result, it is possible to improve the semiconductor production efficiency 16 and 16'.

In the first embodiment, the external-shape regulating member 30 is accommodated in only the cavity structuring section 22a of the lower mold 22 that constitutes the main cavity 23. However, it is also possible to accommodate the external-shape regulating member 30 in only the cavity structuring section 21a of the upper mold 21 or in both cavity structuring sections 22a and 21a. In this case, the external-shape regulating member 30 is not limited to the one that covers only the bottom inner-wall surfaces 21aB and 22aB of the cavity structuring sections 21a and 22a respectively. For example, when an external-shape regulating member that covers only the peripheral inner-wall surfaces 21aA and 22aA of the cavity structuring sections 21a and 22a respectively is applied, it becomes possible to manufacture semiconductor devices having different widths and lengths of sealed resins. Further, when there is applied an external-shape regulating member that covers the bottom inner-wall surfaces 21aB and 22aB and the peripheral inner-wall surfaces 21aA and 22aA of the cavity structuring sections 21a and 22a respectively, it becomes possible to manufacture semiconductor devices that have quite different external sizes and external shapes of sealed resins.

Figure 2:
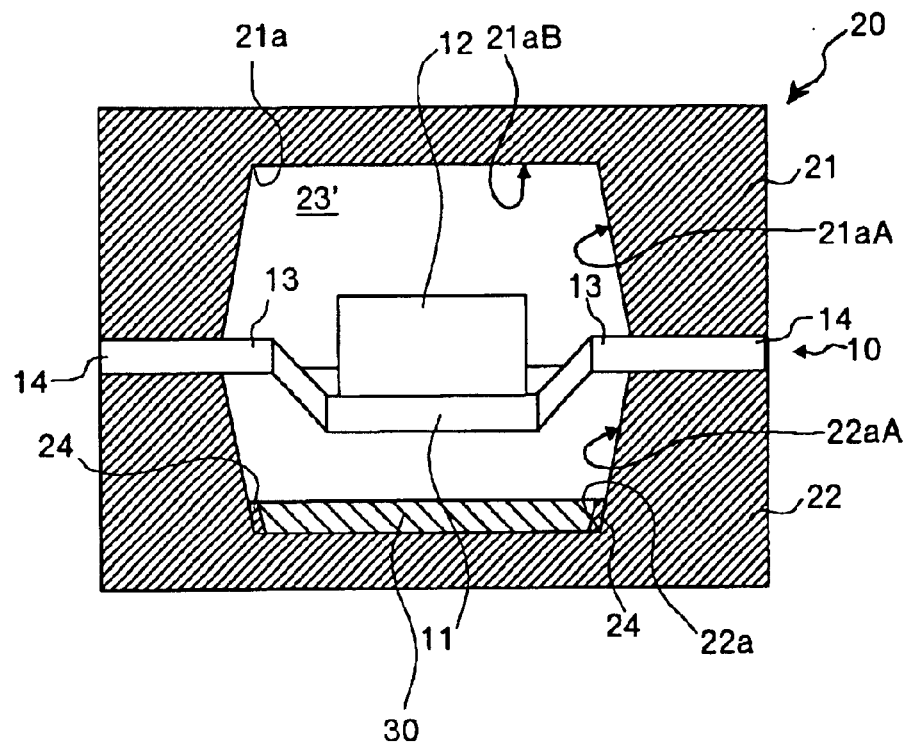
FIG. 2 is a cross-sectional side view of a mold of a resin sealing apparatus according to a first modification of the first embodiment shown in FIG. 1C.
Figure 3:
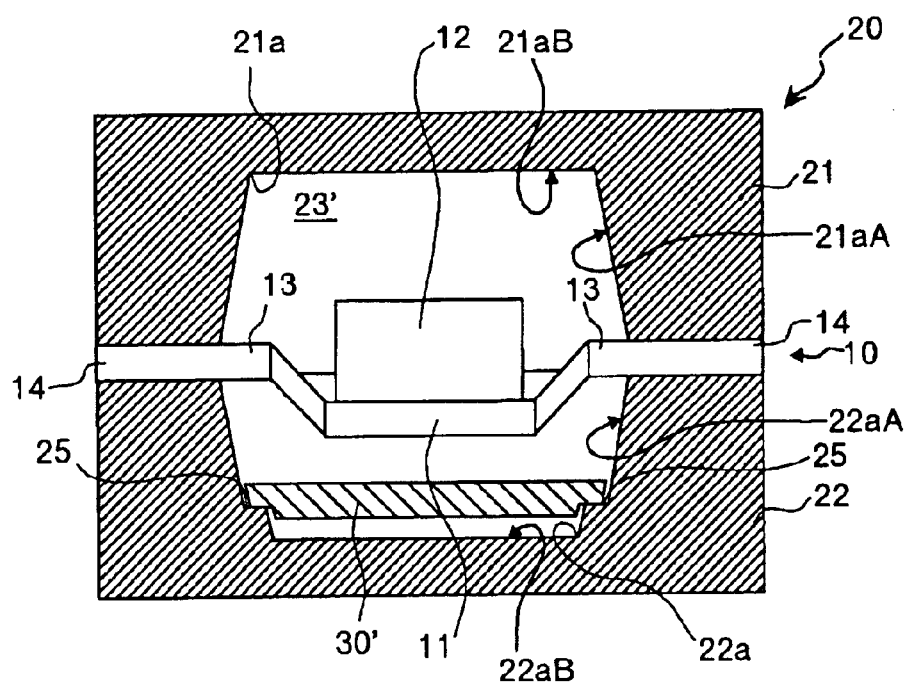
FIG. 3 is a cross-sectional side view of a mold of a resin sealing apparatus according to a second modification of the first embodiment shown in FIG. 1C.

When the external-shape regulating member 30 that constitutes a part of the new cavity 23' is used as explained in the first embodiment, a gap is formed between the inner-wall surfaces 21aA, 21aB, 22aA, and 22aB of the main cavity 23 and the peripheral end surfaces 31 of the external-shape regulating member 30. Thus, there is a risk that a molten resin penetrates into between the main cavity 23 and the external-shape regulating member 30 through this gap at the time of charging the molten resin. In this case, a flash remains on the sealed resin of the semiconductor device after the semiconductor device has been released from the mold. Further, the penetrated molten resin may bring about a positional deviation from the external-shape regulating member 30. Therefore, when the external-shape regulating member 30 that constitutes apart of the new cavity 23' is used, it is preferable to dispose a sealing member 24 between the main cavity 23 and the peripheral end surfaces 31 of the external-shape regulating member 30, as shown in a first modification in FIG. 2. Alternatively, it is preferable to provide a stage 25 on the inner-wall surface 22aA of the main cavity 23, and edges of an external-shape regulating member 30' are installed on the stage 25, as shown in a second modification in FIG. 3. For the sealing member 24 of the first modification, it is possible to use a material made of polytetrafluoroethylene (=Teflon: a brand name), for example.

According to the first modification, the sealing operation of the sealing member 24 makes it possible to prevent the molten resin from penetrating into between the edges of the external-shape regulating member 30 and the inner-wall surface of the main cavity 23 at the time of charging the molten resin. Further, according to the second modification, the stage 25 provided on the inner-wall surface 22aA of the main cavity 23 is securely brought into contact with the edges of the external-shape regulating member 30'. Therefore, it is possible to prevent the molten resin from penetrating into between the edges of the external-shape regulating member 30' and the inner-wall surface 22aA of the main cavity 23 at the time of charging the molten resin. Consequently, it is possible to prevent a positional deviation of the external-shape regulating members 30 and 30' due to the penetration of the molten resin inside the main cavity 23, and it is also possible to restrict the occurrence of flash on the sealed resin of the semiconductor device. As a result, it is possible to improve the quality.

In the first embodiment, external sizes and an external shape of a sealed resin are changed by either accommodating or not accommodating an external-shape regulating member in the main cavity of the mold. According to a second embodiment described in detail below, external sizes and an external shape of a sealed resin are changed by selecting an external-shape regulating member that is to be accommodated in the main cavity from among a plurality of kinds of external-shape regulating members prepared in advance.

Figure 4A:
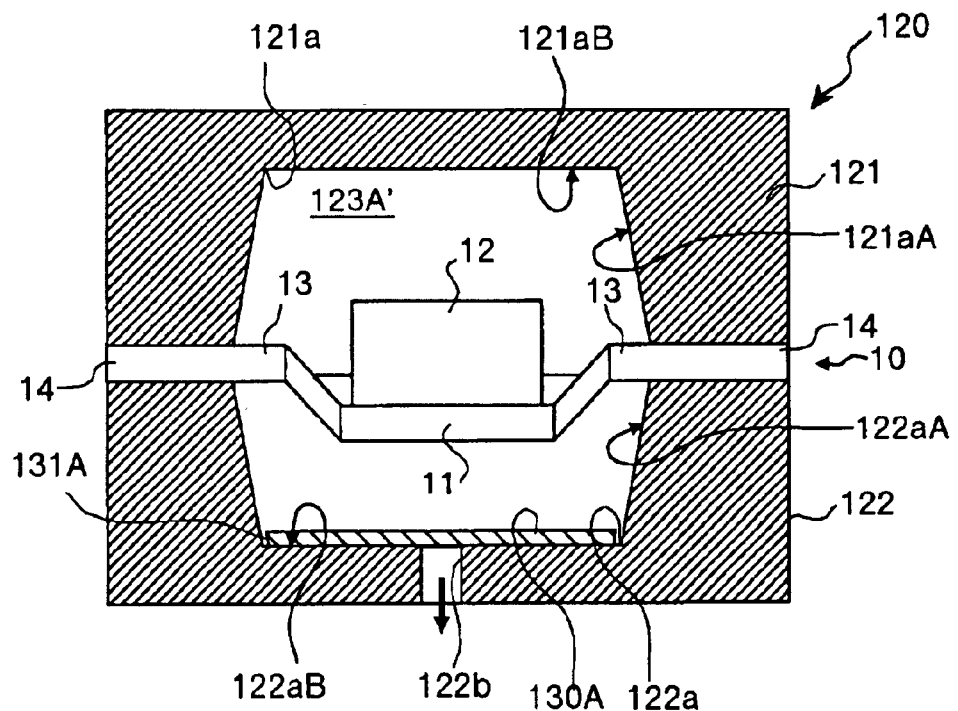
Figure 4B:
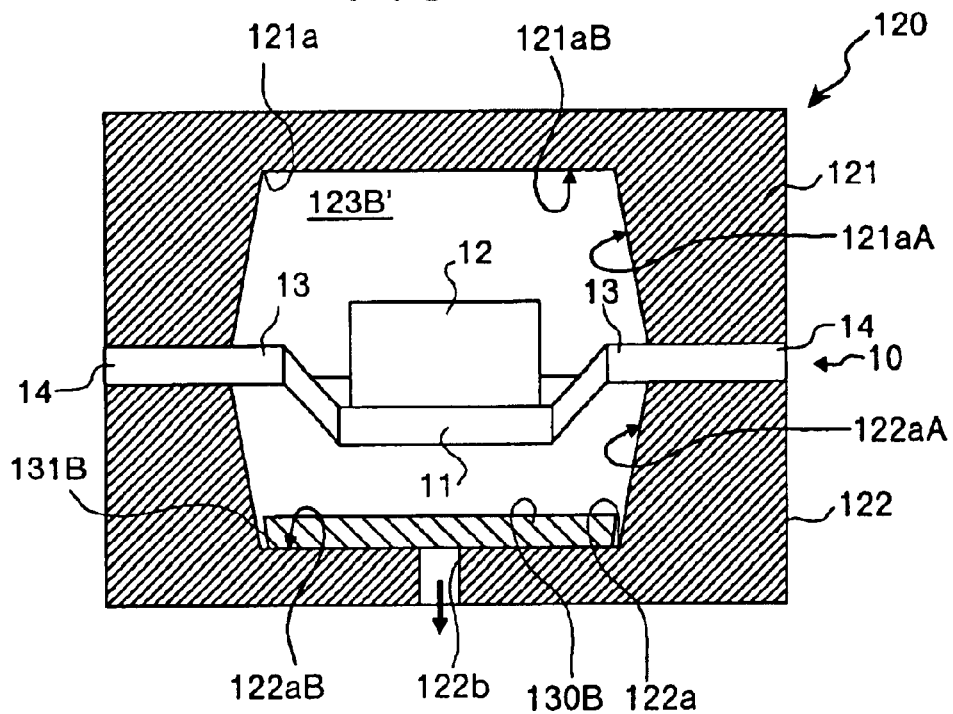

FIG. 4A and FIG. 4B show a resin sealing apparatus according to the second embodiment of the present invention. Like in the first embodiment, the resin sealing apparatus of the second embodiment is for manufacturing semiconductor devices such as an SOP and a TSOP. The resin sealing apparatus seals a semiconductor chip 12 mounted on a die pad section 11 of a lead frame 10, and an inner bonding portion, with seal resins to have mutually different thicknesses. Further, the resin sealing apparatus extends an outer lead 14 of the lead frame 10 to the outside of the sealed resins. The resin sealing apparatus of the second embodiment comprises a mold 120 and a plurality of kinds, i.e., two kinds in the second embodiment, of external-shape regulating members 130A and 130B.

The mold 120 consists of an upper mold 121 and a lower mold 122 disposed such that they can be opened or closed together. The upper mold 121 and the lower mold 122 are provided with cavity structuring sections 121a and 122a respectively at mutually opposite positions or at one position. The cavity structuring sections 121a and 122a are the portions that constitute a main cavity large enough to accommodate the die pad section 11 on which the semiconductor chip 12 is mounted, an inner lead 13, and the inner bonding portion, on the lead frame 10, when the upper mold 121 and the lower mold 122 are closed together. Peripheral inner-wall surfaces 121aA and 122aA that correspond to peripheral walls of the cavity structuring sections 121a and 122a are provided with release slopes respectively.

Further, the mold 120 of the second embodiment is provided with a vacuum path 122b as close-contact holding unit at a center position of the bottom inner-wall surface 122aB on the cavity structuring section 122a of the lower mold 122. The vacuum path 122b has its one end opened to the cavity structuring section 122a of the lower mold 122 and has the other end connected to a vacuum generator not shown.

The two kinds of external-shape regulating members 130A and 130B are detachably accommodated in the cavity structuring section 122a of the lower mold 122, and are structured in a plate shape having mutually different thicknesses. The external-shape regulating members 130A and 130B have sizes to cover substantially the whole area of a bottom inner-wall surface 122aB in the cavity structuring section 122a, when the external-shape regulating members 130A and 130B have been accommodated in the cavity structuring section 122a of the lower mold 122 respectively. Peripheral end surfaces 131A and 131B of the external-shape regulating members 130A and 130B that face the peripheral inner-wall surface 122aB of the cavity structuring section 122a are provided with slopes corresponding to the release slope respectively. In the following explanation, for the sake of convenience, a external-shape regulating member having a smaller thickness will hereinafter be called a first external-shape regulating member 130A, and a external-shape regulating member having a larger thickness will hereinafter be called a second external-shape regulating member 130B.

For carrying out a resin sealing in the resin sealing apparatus having the above-mentioned structure, it is first decided which one of the external-shape regulating member 130A and the external-shape regulating member 130B is to be accommodated in the main cavity of the mold 120 in accordance with the thickness of the sealed resin of the semiconductor devices to be manufactured.

Namely, in the case of manufacturing a semiconductor device having a large thickness of a sealed resin, the first external-shape regulating member 130A is disposed in advance in the cavity structuring section 122a of the lower mold 122, as shown in FIG. 4A. On the other hand, in the case of manufacturing a semiconductor device having a small thickness of a sealed resin, the second external-shape regulating member 130B is disposed in advance in the cavity structuring section 122a of the lower mold 122, as shown in FIG. 4B. In this state, new cavities 123A' and 123B' are formed at a position above the upper surface of the external-shape regulating member 130A and 130B, inside the main cavity that is formed between the upper mold 121 and the lower mold 122 respectively. Therefore, only the new cavities 123A' and 123B' are to be charged with the molten resin. As the plate thickness of the second external-shape regulating member 130B is set larger than that of the first external-shape regulating member 130A, the new cavity 123A' formed by using the first external-shape regulating member 130A has a larger thickness than the new cavity 123B' formed by using the second external-shape regulating member 130B. Accordingly, when the molten resin is charged in the respective statuses and the molten resin is cured thereafter, it becomes possible to manufacture the semiconductor devices having mutually different thicknesses.

In the second embodiment, the vacuum generator is driven based on the accommodation of the external-shape regulating members 130A and 130B respectively. With this operation, the external-shape regulating members 130A and 130B are held on the bottom inner-wall surface 122aB by being closely contacted thereto via the vacuum path 122b in the cavity structuring section 122a of the lower mold 122. As a result, it is possible to prevent the molten resin from penetrating into between the edges of the external-shape regulating members 130A and 130B and the inner-wall surface of the main cavity 23, without disposing the sealing member 24 or without providing the stage 25 like in the first modification.

As explained, according to the resin sealing apparatus of the second embodiment, it is possible to change the thickness of the sealed resin by selecting one of the external-shape regulating members 130A and 130B that is accommodated into the main cavity of the mold. Therefore, it is not necessary to design and manufacture a new mold 120 following a change in the thickness of the sealed resin. Consequently, it becomes possible to promptly respond to the requirement, and it is also possible to lower the cost of manufacturing the semiconductors. Further, in the case of continuously manufacturing semiconductor devices having mutually different thicknesses in the sealed resins, it is not necessary to replace the mold 120 in the preparation work. Further, as a slope is formed on the peripheral end surfaces 131A and 131B of the external-shape regulating members 130A and 130B along the peripheral inner-wall surface 122aA of the main cavity respectively, it becomes easy to mount and dismount the external-shape regulating members 130A and 130B onto/from the main cavity. As a result, it is possible to improve the semiconductor production efficiency.

In the second embodiment, the external-shape regulating members 130A and 130B are accommodated in only the cavity structuring section 122a of the lower mold 122 that constitutes the main cavity. However, it is also possible to accommodate the external-shape regulating members 130A and 130B in only the cavity structuring section 121a of the upper mold 121 or in both cavity structuring sections 122a and 121a. In this case, the external-shape regulating members 130A and 130B are not limited to the ones that cover only the bottom inner-wall surfaces 121aB and 122aB of the cavity structuring sections 121a and 122a respectively. For example, when external-shape regulating members that cover only the peripheral inner-wall surfaces 121aA and 122aA of the cavity structuring sections 121a and 122a respectively are applied, it becomes possible to manufacture semiconductor devices having different widths and lengths of sealed resins. Further, when there are applied external-shape regulating members that cover the bottom inner-wall surfaces 121aB and 122aB and the peripheral inner-wall surfaces 121aA and 122aA of the cavity structuring sections 121a and 122a respectively, it becomes possible to manufacture semiconductor devices that have quite different external sizes and external shapes of sealed resins. Further, the plurality of kinds of external-shape regulating members 130A and 130B do not need to have similar structures. For example, it may be structured as follows. That is, one external-shape regulating member covers only the bottom inner-wall surfaces 121aB and 122aB of the cavity structuring sections 121a and 122a. The other external-shape regulating member covers only the peripheral inner-wall surfaces 121aA and 122aA of the cavity structuring sections 121a and 122a, or covers both the peripheral inner-wall surfaces 121aA and 122aA and the bottom inner-wall surfaces 121aB and 122aB. Further, although two kinds of external-shape regulating members are used, it is needless to mention that three or more kinds of external-shape regulating members may be used as the plurality of external-shape regulating members 130A and 130B.

Further, in the second embodiment, although close-contact holding unit is provided on the mold 120, it is not always necessary to provide the close-contact holding unit. When the close-contact holding unit is not provided and the external-shape regulating members 130A and 130B constitute a part of the new cavities 123A' and 123B', it is preferable to arrange as follows. The sealing member 24 is disposed between the main cavity and the peripheral inner-wall surfaces 131A and 131B of the external-shape regulating members 130A and 130B. Alternatively, the stage 25 is provided on the inner-wall surface of the main cavity, and the edges of the external-shape regulating members 130A and 130B are installed on this stage 25, like in the first embodiment.

In the first and second embodiments, external sizes and an external shape of a sealed resin are changed by accommodating an external-shape regulating member in the main cavity of the mold. According to a third embodiment described in detail below, external sizes and an external shape of a sealed resin are changed by disposing a spacer member between the upper mold and the lower mold.

Figure 5A:
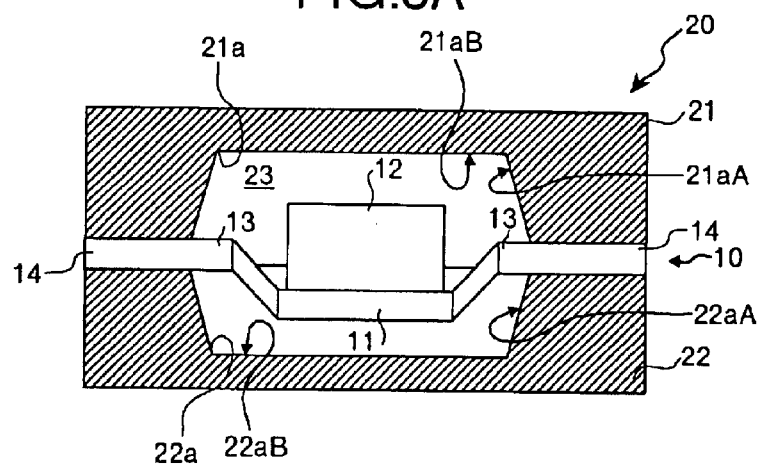
Figure 5B:
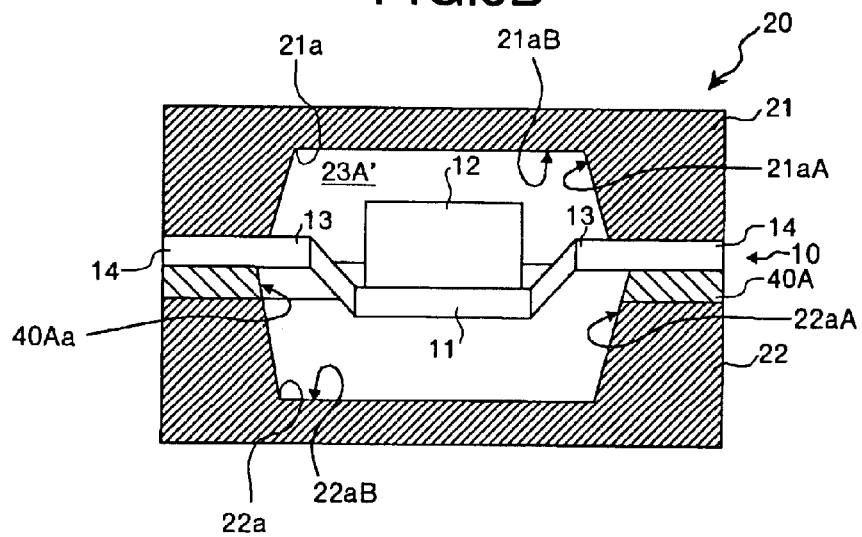
Figure 5C:
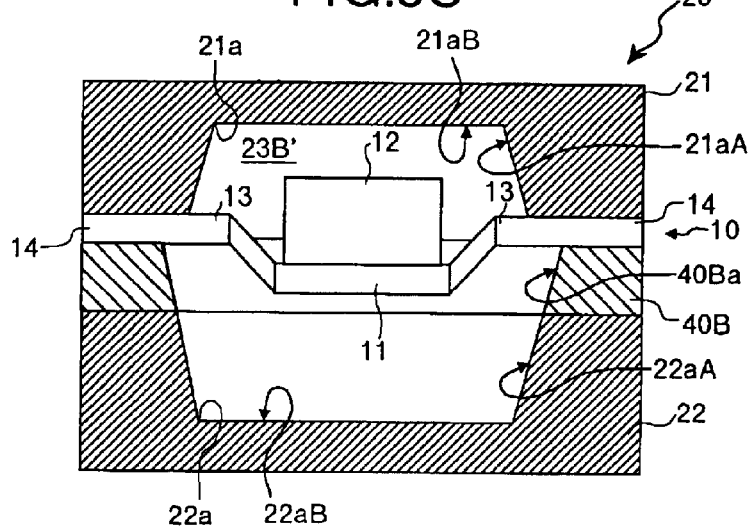

FIG. 5A to FIG. 5C show a resin sealing apparatus according to the third embodiment of the present invention. Like in the first and second embodiments, the resin sealing apparatus of the third embodiment is for manufacturing semiconductor devices such as an SOP and a TSOP. The resin sealing apparatus seals a semiconductor chip 12 mounted on a die pad section 11 of a lead frame 10, and an inner bonding portion, with a seal resin. Further, the resin sealing apparatus extends an outer lead 14 of the lead frame 10 to the outside of the sealed resin. The resin sealing apparatus of the third embodiment comprises a mold 20 and a plurality of kinds, i.e., two kinds in the second embodiment, of spacer members 40A and 40B.

The structure of the mold 20 is similar to that of the first embodiment. Therefore, the same reference number is attached to this mold, and a detailed explanation of the mold will be omitted.

The two kinds of spacer members 40A and 40B are detachably fixed on the upper surface of the lower mold 22, and have mutually different thicknesses. The spacer members 40A and 40B are provided with auxiliary cavity structuring sections 40A$a$ and 40B$a$ for extending a cavity structuring section 22$a$ of the lower mold 22 when disposed on the upper surface of the lower mold 22 respectively. In the following explanation, for the sake of convenience, a spacer member having a smaller thickness will hereinafter be called a first spacer member 40A, and a spacer member having a larger thickness will hereinafter be called a second spacer member 40B.

For carrying out a resin sealing in the resin sealing apparatus having the above-explained structure, it is first decided whether the spacer members 40A and 40B are to be disposed or not. When the spacer members 40A and 40B are disposed, it is decided which one of the spacer members 40A and 40B is to be disposed between the upper mold 21 and the lower mold 22 in accordance with the thickness of the sealed resin of the semiconductor devices to be manufactured.

Namely, in the case of manufacturing a semiconductor device having a small thickness of a sealed resin, a lead frame 10 is disposed on a main cavity 23 formed between the upper mold 21 and the lower mold 22 in a status that the spacer members 40A and 40B are not fixedly installed on the upper surface of the lower mold 22, as shown in FIG. 5A. In this state, only the main cavity 23 formed between the upper mold 21 and the lower mold 22 becomes the capacity to be charged with a molten resin. Accordingly, when the molten resin is charged in this state and the molten resin is cured thereafter, it becomes possible to manufacture a semiconductor device having a small thickness of the sealed resin.

On the other hand, in the case of manufacturing a semiconductor device having an intermediate thickness of a sealed resin, the first spacer member 40A is fixedly installed on the upper surface of the lower mold 22, as shown in FIG. 5B. In this state, a new cavity 23A' is formed in the main cavity 23 formed between the upper mold 21 and the lower mold 22, with the addition of the auxiliary cavity structuring section 40A$a$ of the first spacer member 40A between the upper mold 21 and the lower mold 22. The new cavity 23A' becomes the capacity to be charged with a molten resin in this state. Accordingly, when the molten resin is charged in this state and the molten resin is cured thereafter, it becomes possible to manufacture a semiconductor device having a larger thickness of the sealed resin than that shown in FIG. 5A.

Further, in the case of manufacturing a semiconductor device having a large thickness of a sealed resin, the second spacer member 40B is fixedly installed on the upper surface of the lower mold 22, as shown in FIG. 5C. In this state, a new cavity 23B' is formed in the main cavity 23 formed between the upper mold 21 and the lower mold 22, with the addition of the auxiliary cavity structuring section 40B$a$ of the second spacer member 40B between the upper mold 21 and the lower mold 22. The new cavity 23B' becomes the capacity to be charged with a molten resin in this state. The auxiliary cavity structuring section 40B$a$ of the second spacer member 40B is larger than the auxiliary cavity structuring section 40A$a$ of the first spacer member 40A. Accordingly, when the molten resin is charged in this state and the molten resin is cured thereafter, it becomes possible to manufacture a semiconductor device having a larger thickness of the sealed resin than that shown in FIG. 5B.

As explained, according to the resin sealing apparatus of the third embodiment, it is possible to change the thickness of the sealed resin by deciding whether the spacer members 40A and 40B are to be disposed between the upper mold 21 and the lower mold 22 or not, and by selecting one of the spacer members 40A and 40B that is disposed between the upper mold 21 and the lower mold 22. Therefore, it is not necessary to design and manufacture a new mold 20 following a change in the thickness of the sealed resin. Consequently, it becomes possible to promptly respond to the requirement, and it is also possible to lower the cost of manufacturing the semiconductors. Further, in the case of continuously manufacturing semiconductor devices having mutually different thicknesses in the sealed resins, it is not necessary to replace the mold 20 in the preparation work. As a result, it is possible to improve the semiconductor production efficiency.

In the third embodiment, the spacer members 40A and 40B are fixedly installed on only the upper surface of the lower mold 22. However, it is also possible to fixedly install the spacer members 40A and 40B on only the lower surface of the upper mold 21, or on both the upper surface and the of the lower mold 22 and the lower surface of the upper mold 21. Further, although two kinds of spacer members are prepared for selection, it is needless to mention that three or more kinds of spacer members may be prepared as the plurality of spacer members 40A and 40B. Further, the spacer members 40A and 40B are not necessarily disposed between the upper mold 21 and the lower mold 22. When the spacer members 40A and 40B have portions to cover the peripheral inner-wall surface 22$a$A in the cavity structuring section 22$a$ of the lower mold 22, for example, it becomes possible to manufacture semiconductor devices having different widths and lengths of the sealed resins.

Fourth Embodiment

In the first and second embodiments, external sizes and an external shape of a sealed resin are changed by accommodating an external-shape regulating member in the main cavity of the mold. According to a fourth embodiment described in detail below, external sizes and an external shape of a sealed resin are changed by proceeding an external-shape regulating member to a mold.

Figure 6A:
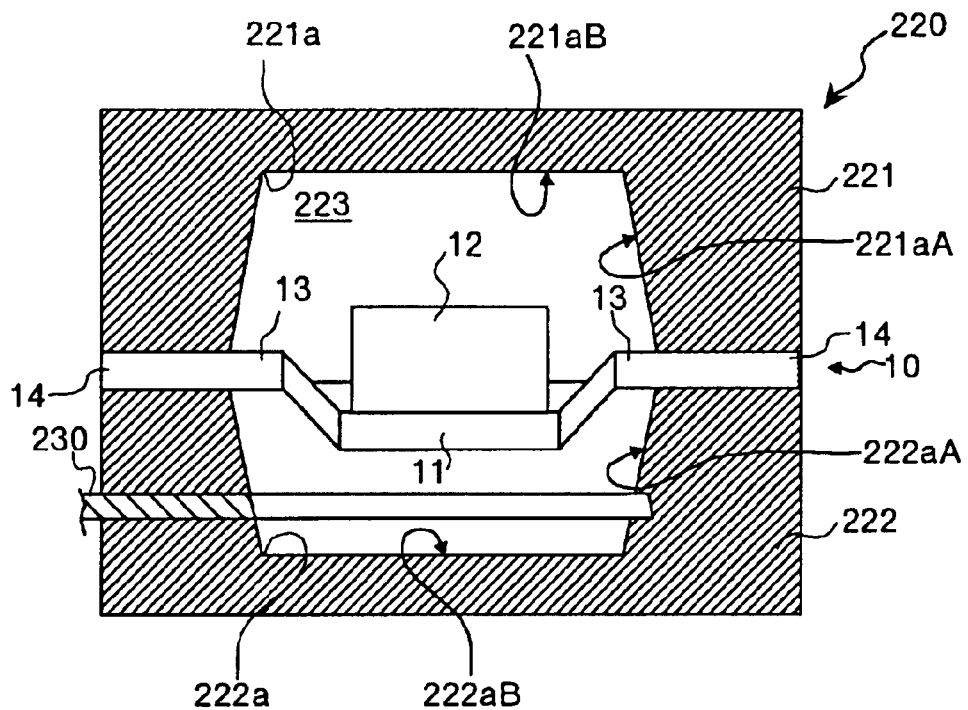
Figure 6B:
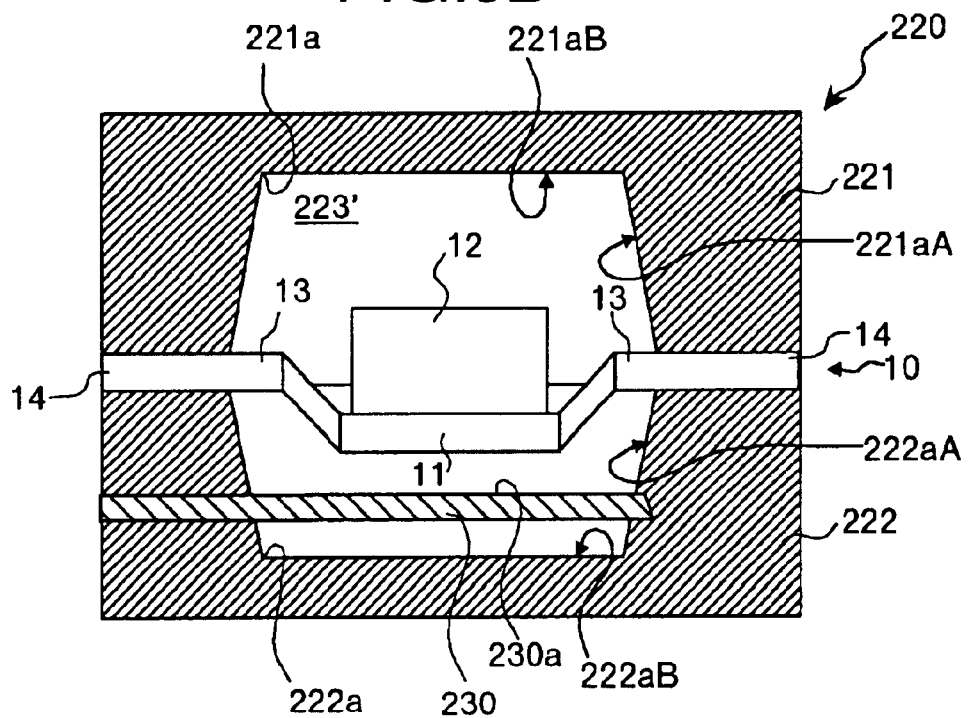

FIG. 6A and FIG. 6B show a resin sealing apparatus according to the fourth embodiment of the present invention. Like in the first embodiment, the resin sealing apparatus of the third embodiment is for manufacturing semiconductor devices such as an SOP and a TSOP. The resin sealing apparatus seals a semiconductor chip 12 mounted on a die pad section 11 of a lead frame 10, and an inner bonding portion, with a seal resin. Further, the resin sealing apparatus extends an outer lead 14 of the lead frame 10 to the outside of the sealed resin. The resin sealing apparatus of the fourth embodiment comprises a mold 220.

The mold 220 consists of an upper mold 221 and a lower mold 222 disposed such that they can be opened or closed together. The upper mold 221 and the lower mold 222 are provided with cavity structuring sections 221$a$ and 222$a$ respectively at mutually opposite positions or at one position. The cavity structuring sections 221$a$ and 222$a$ are the portions that constitute a main cavity 223 large enough to accommodate the die pad section 11 on which the semiconductor chip 12 is mounted, the inner lead 13, and the inner bonding portion, on the lead frame 10, when the upper mold 221 and the lower mold 222 are closed together. In the fourth embodiment, peripheral inner-wall surfaces 221*a*A and 222*a*A that correspond to peripheral walls of the cavity structuring sections 221*a* and 222*a* are provided with release slopes respectively.

The mold 220 of the fourth embodiment has an external-shape regulating member 230 provided on the lower mold 222 thereof. This external-shape regulating member 230 is disposed such that it can proceed to and recede from the cavity structuring section 222*a* of the lower mold 222 along a bottom inner-wall surface 222*a*B.

For carrying out a resin sealing in the resin sealing apparatus having the structure, it is first decided whether or not the external-shape regulating member 230 is to be proceeded to the main cavity 223 of the mold 220 in according with the thickness of the sealed resin of a semiconductor device to be manufactured.

Namely, in the case of manufacturing a semiconductor device having a large thickness of a sealed resin, the lead frame 10 is disposed in the main cavity 223 in a status that the external-shape regulating member 230 has been receded from the main cavity 223, as shown in FIG. 6A. In this state, the whole main cavity 223 that is formed between the upper mold 221 and the lower mold 222 becomes the capacity to be charged with a molten resin. Accordingly, when the molten resin is charged in this state and the molten resin is cured thereafter, it becomes possible to manufacture a semiconductor device having a large thickness of the sealed resin.

On the other hand, in the case of manufacturing a semiconductor device having a smaller thickness of the sealed resin than that of the sealed resin of the semiconductor device shown in FIG. 6B, the external-shape regulating member 230 is proceeded in advance, as shown in FIG. 6B. In this state, a new cavity 223' is formed at a portion above an upper surface 230*a* of the external-shape regulating member 230, inside the main cavity 223 that is formed between the upper mold 221 and the lower mold 222. Therefore, only the new cavity 223' becomes the capacity to be charged with the molten resin. Accordingly, when the molten resin is charged in this state and the molten resin is cured thereafter, it becomes possible to manufacture a semiconductor device having a relatively small thickness of the sealed resin.

As explained, according to the resin sealing apparatus of the fourth embodiment, it is possible to change the thickness of the sealed resin by proceeding the external-shape regulating member 230 to the main cavity 223 of the mold 220. Therefore, it is not necessary to design and manufacture a new mold 220 following a change in the thickness of the sealed resin. Consequently, it becomes possible to promptly respond to the requirement, and it is also possible to lower the cost of manufacturing semiconductors. Further, in the case of continuously manufacturing semiconductor devices having mutually different thicknesses in the sealed resins, it is not necessary to replace the mold 220 in the preparation work. As a result, it is possible to improve the semiconductor production efficiency.

In the fourth embodiment, the external-shape regulating member 230 is provided in only the lower mold 222 that constitutes the main cavity 223. However, it is also possible to provide the external-shape regulating member 230 in only the upper mold 221 or in both the upper mold 221 and the lower mold 222. In this case, the external-shape regulating member 230 is not limited to the one that covers only the bottom inner-wall surfaces 221*a*B and 222*a*B of the cavity structuring sections 221*a* and 222*a* when proceeded. For example, based on the application of an external-shape regulating member that covers only the peripheral inner-wall surfaces 221*a*A and 222*a*A of the cavity structuring sections 221*a* and 222*a* when proceeded, it becomes possible to manufacture semiconductor devices having different widths and lengths of sealed resins. Further, based on the application of an external-shape regulating member that covers the bottom inner-wall surfaces 221*a*B and 222*a*B and the peripheral inner-wall surfaces 221*a*A and 222*a*A of the cavity structuring sections 221*a* and 222*a* respectively when proceeded, it becomes possible to manufacture semiconductor devices that have quite different external sizes and external shapes of sealed resins.

Figure 7:
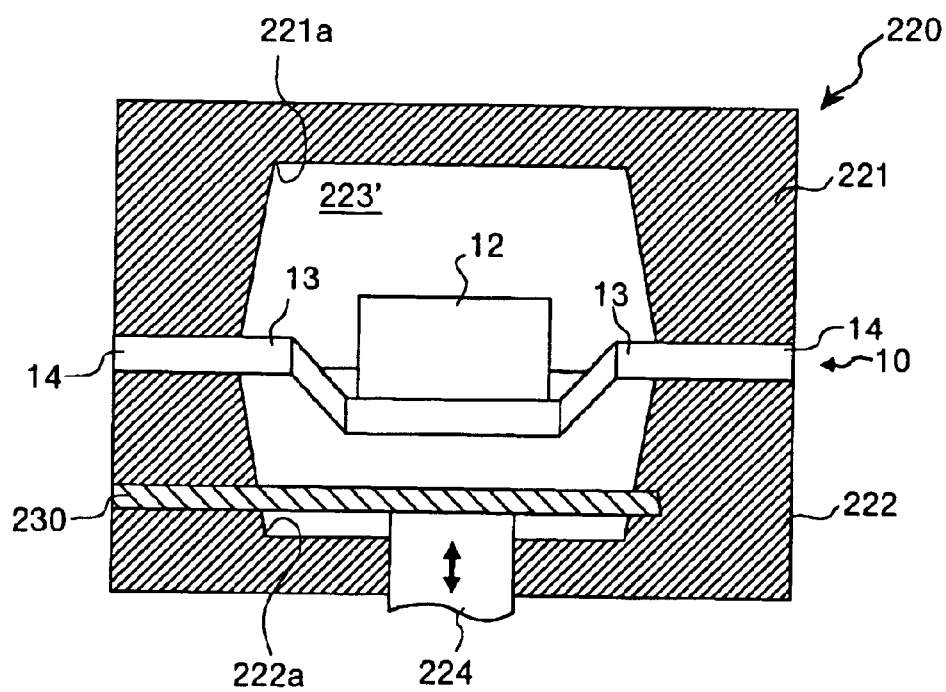
FIG. 7 is a cross-sectional side view of a mold of a resin sealing apparatus according to a first modification of the fourth embodiment shown in FIG. 6A and FIG. 6B.
Figure 8:
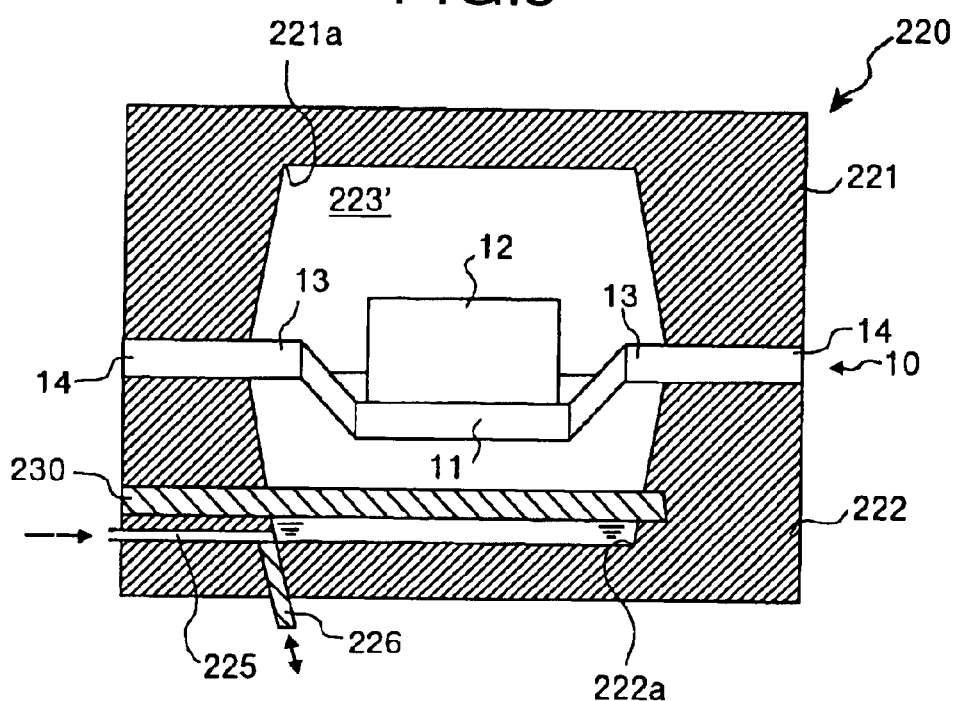
FIG. 8 is a cross-sectional side view of a mold of a resin sealing apparatus according to a second modification of the fourth embodiment shown in FIG. 6A and FIG. 6B.

In the fourth embodiment, a gap is formed between the proceeded external-shape regulating member 230 and the bottom inner-wall surface 222*a*B of the cavity structuring section 222*a*. Therefore, there is a risk of the occurrence of deformation of the external-shape regulating member like flexure at the time of charging a molten resin, depending on the charging pressure. In this case, it is preferable to dispose a supporting rod 224 on the lower mold 222 such that the supporting rod 224 can proceed or recede thereby to support the lower surface of the external-shape regulating member 230 when it has proceeded, as shown in a first modification in FIG. 7. Alternatively, it is preferable to provide a fluid supply path 225 below the lower surface of the external-shape regulating member 230 in the cavity structuring section 222*a* of the lower mold 222. Then, a fluid is supplied through this path to support the lower surface of the external-shape regulating member 230 with pressure when the external-shape regulating member 230 has proceeded, as shown in a second modification in FIG. 8. A reference number 226 in FIG. 8 denotes a valve unit which closes the fluid supply path 225 when the external-shape regulating member 230 is receded.

According to the first and second modifications, it is possible to prevent deformation of the external-shape regulating member 230 at the time of charging the molten resin. Therefore, it is possible to obtain external sizes and an external shape of a sealed resin as desired. As a result, it is possible to improve the quality of semiconductor devices.

Figure 9:
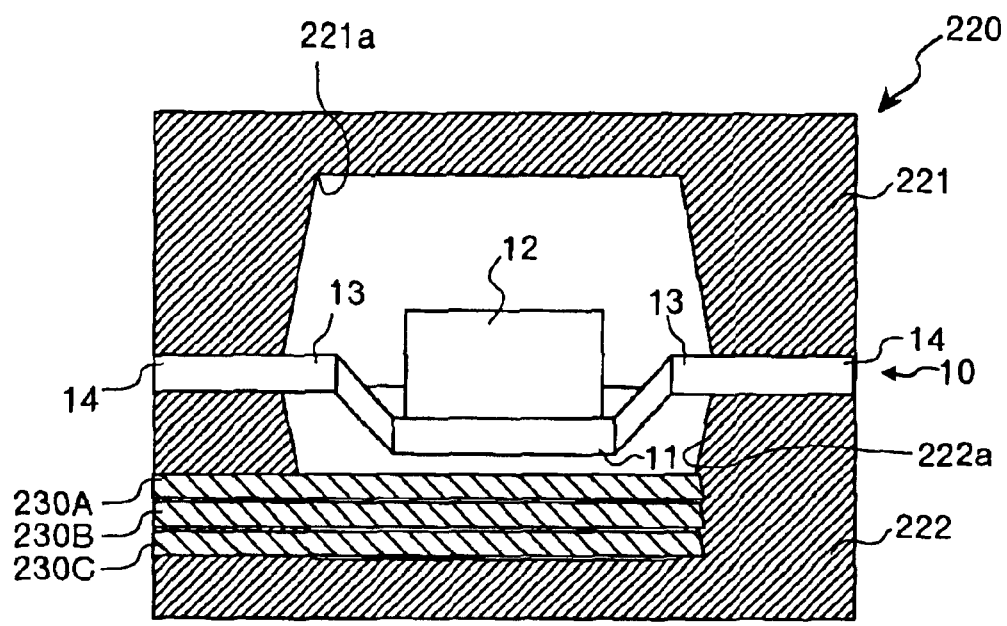
FIG. 9 is a cross-sectional side view of a mold of a resin sealing apparatus according to a third modification of the fourth embodiment shown in FIG. 6A and FIG. 6B.

In the fourth embodiment, external sizes and an external shape of a sealed resin are changed by selecting whether the external-shape regulating member 230 is to be proceeded or not. It is also possible to dispose a plurality of external-shape regulating members 230A, 230B, and 230C in parallel with each other on the mold 220, as shown in a third modification in FIG. 9. It is possible to obtain a similar work effect when these external-shape regulating members 230A, 230B, and 230C are selectively proceeded to the main cavity 223. Further, it is also possible to change external sizes and an external shape of a sealed resin to a plurality of kinds of sizes and shapes in the same mold 220. As a result, it is possible to further reduce the cost of manufacturing semiconductors, and to further improve the production efficiency. In the third modification, it is not always necessary to provide the external-shape regulating members 230A, 230B, and 230C on only the lower mold 222 that constitutes the main cavity 223. It is also possible to provide the external-shape regulating members 230A, 230B, and 230C on only the upper mold 221, or on both the upper mold 221 and the lower mold 222.

In the first and second embodiments, external sizes and an external shape of a sealed resin are changed by accommodating an external-shape regulating member in the main cavity of the mold. According to a fifth embodiment described in detail below, external sizes and an external shape of a sealed resin are changed by providing a portion of a mold that constitutes a peripheral wall of the mold such that this mold section can be expanded and contracted in the main cavity of the mold.

Figure 10A:
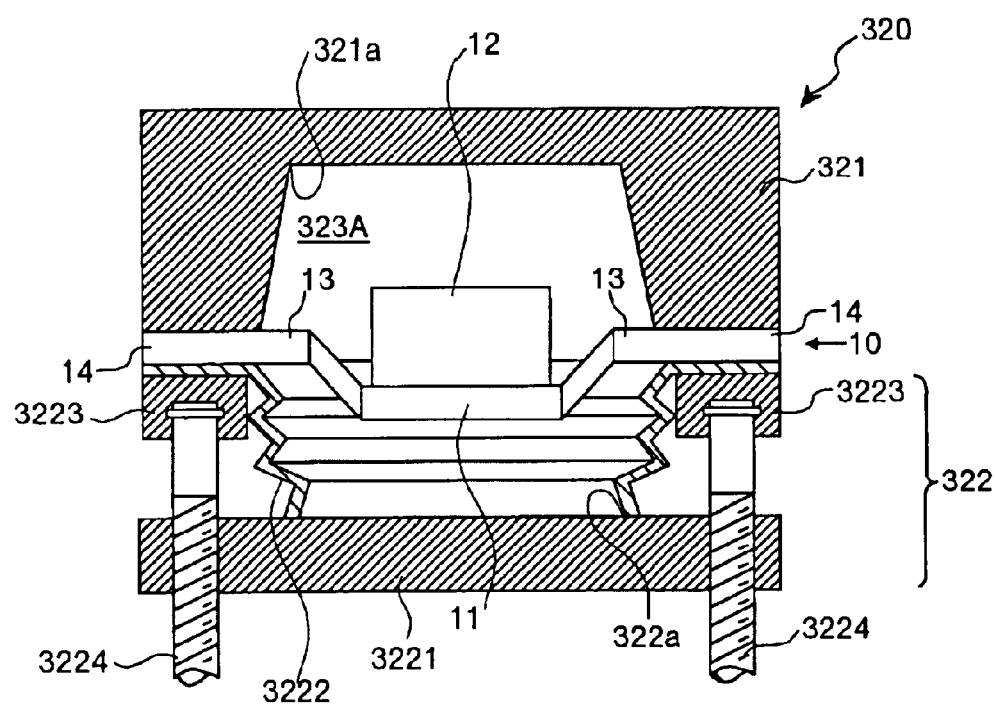
Figure 10B:
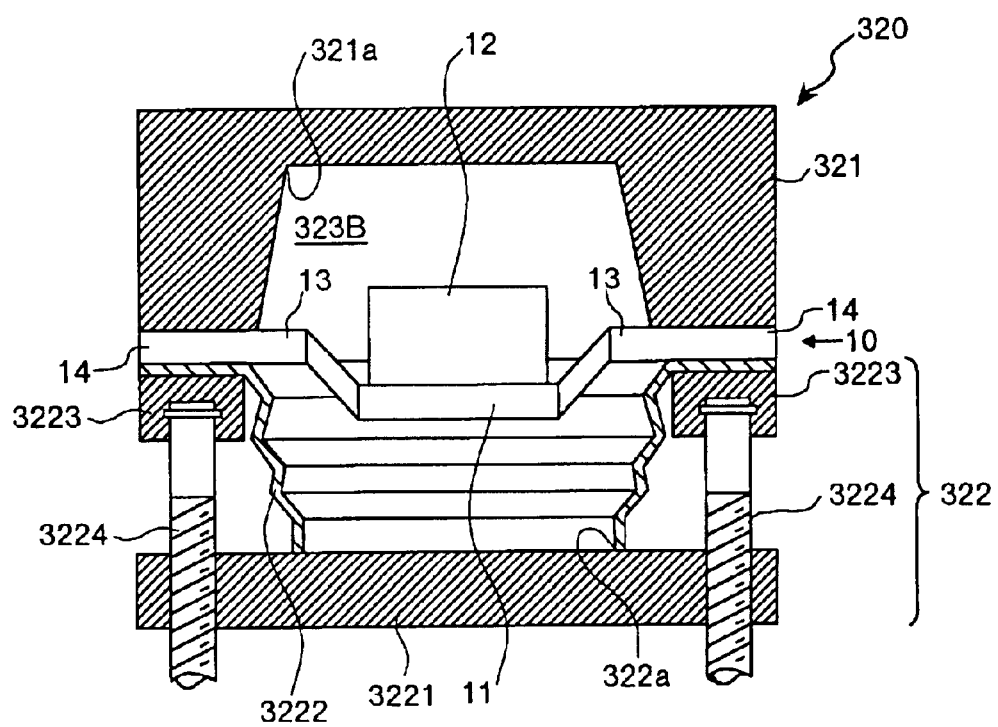

FIG. 10A and FIG. 10B show a resin sealing apparatus according to the fifth embodiment of the present invention. Like in the first embodiment, the resin sealing apparatus of the fifth embodiment is for manufacturing semiconductor devices such as an SOP and a TSOP. The resin sealing apparatus seals a semiconductor chip 12 mounted on a die pad section 11 of a lead frame 10, and an inner bonding portion, with a seal resin. Further, the resin sealing apparatus extends an outer lead 14 of the lead frame 10 to the outside of the sealed resin. The resin sealing apparatus of the fifth embodiment comprises a mold 320.

The mold 320 consists of an upper mold 321 and a lower mold 322 disposed such that they can be opened or closed together. The upper mold 321 and the lower mold 322 are provided with cavity structuring sections 321a and 322a respectively at mutually opposite positions or at one position. The cavity structuring sections 321a and 322a are the portions that constitute a main cavity large enough to accommodate the die pad section 11 on which the semiconductor chip 12 is mounted, the inner lead 13, and the inner bonding portion, on the lead frame 10, when the upper mold 321 and the lower mold 322 are closed together.

Of the mold 320, the upper mold 321 has a structure similar to those of the first to fourth embodiments described above. However, in the fifth embodiment, the lower mold 322 is structured such that the portion of the mold that becomes the peripheral wall of the cavity structuring section 322a can be expanded or contracted along a height direction. Specifically, a bellows-type peripheral mold section 3222 is provided on the upper surface of a reference mold section 3221 that becomes a bottom wall of the cavity structuring section 322a, thereby to constitute the lower mold 322. The lower end portion of the peripheral mold section 3222 is firmly fixed to the upper surface of the reference mold section 3221. On the other hand, the upper end portion of the peripheral mold section 3222 is extended to the outside, and the peripheral mold section 3222 is held on a lifting member 3223 via this extended portion. The lifting member 3223 is structured to face the lower surface of the upper mold 321. The lifting member 3223 is fixed to the reference mold section 3221 such that the height can be changed via a plurality of height-adjusting bolts 3224.

For carrying out a resin sealing in the resin sealing apparatus having the structure, the height-adjusting bolts 3224 are suitably screwed according to the thickness of a sealed resin of a semiconductor device to be manufactured. Thus, the height of the peripheral mold section 3222 on the reference mold section 3221 is adjusted.

Namely, in the case of manufacturing a semiconductor device having a small thickness of a sealed resin, the height-adjusting bolts 3224 are suitably screwed to move the reference mold section 3221 upward along the height-adjusting bolts 3224. Thus, the lifting member 3223 is brought close to the reference mold section 3221, thereby to set a small height to the peripheral mold section 3222, as shown in FIG. 10A. In this state, the peripheral mold section 3222 is suitably contracted to set a small height to the cavity structuring section 322a that is formed between the reference mold section 3221 and the peripheral mold section 3222. Consequently, a relatively small main cavity 323A is formed between the upper mold 321 and the lower mold 322. Accordingly, when a molten resin is charged in this state and the molten resin is cured thereafter, it becomes possible to manufacture a semiconductor device having a small thickness of the sealed resin.

On the other hand, in the case of manufacturing a semiconductor device having a larger thickness of the sealed resin than that of the semiconductor device shown in FIG. 10A, the height-adjusting bolts 3224 are suitably screwed to move the reference mold section 3221 downward along the height-adjusting bolts 3224. Thus, the lifting member 3223 is brought far from the reference mold section 3221, thereby to set a large height to the peripheral mold section 3222, as shown in FIG. 10B. In this state, the peripheral mold section 3222 is suitably expanded to set a large height to the cavity structuring section 322a that is formed between the reference mold section 3221 and the peripheral mold section 3222. Consequently, a relatively large main cavity 323B is formed between the upper mold 321 and the lower mold 322. Accordingly, when a molten resin is charged in this state and the molten resin is cured thereafter, it becomes possible to manufacture a semiconductor device having a large thickness of the sealed resin.

As explained, according to the resin sealing apparatus of the fifth embodiment, it is possible to change the thickness of the sealed resin in accordance with an expanded or contracted status of the peripheral mold section 3222. Therefore, it is not necessary to design and manufacture a new mold following a change in the thickness of the sealed resin. Consequently, it becomes possible to promptly respond to the requirement, and it is also possible to prevent an increase in the cost of manufacturing semiconductors. Further, in the case of continuously manufacturing semiconductor devices having mutually different thicknesses, it is not necessary to replace the mold in the preparation work. As a result, it is possible to improve the semiconductor production efficiency.

In the fifth embodiment, only the peripheral mold section 3222 of the lower mold 322 can be expanded or contracted. However, it is also possible to structure such that only the peripheral mold section of the upper mold 321 can be expanded or contracted. Alternatively, both the peripheral mold section 3222 of the lower mold 322 and the peripheral mold section of the upper mold 321 can be expanded or contracted. Further, although the peripheral mold section 3222 is expanded and contracted based on a bellows shape, the expansion and contraction is not limited to this method in the present invention. For example, it is also possible to structure the peripheral mold section with an elastic material. It is also possible to structure the peripheral mold section by sequentially nesting a plurality of frame members.

In the first and second embodiments, external sizes and an external shape of a sealed resin are changed by accommodating an external-shape regulating member in the main cavity of the mold. According to a sixth embodiment described in detail below, external sizes and an external shape of a sealed resin are changed by providing a portion of a mold that constitutes a peripheral wall of the mold such that this mold section can proceed to and recede from a predetermined reference mold section.

Figure 11A:
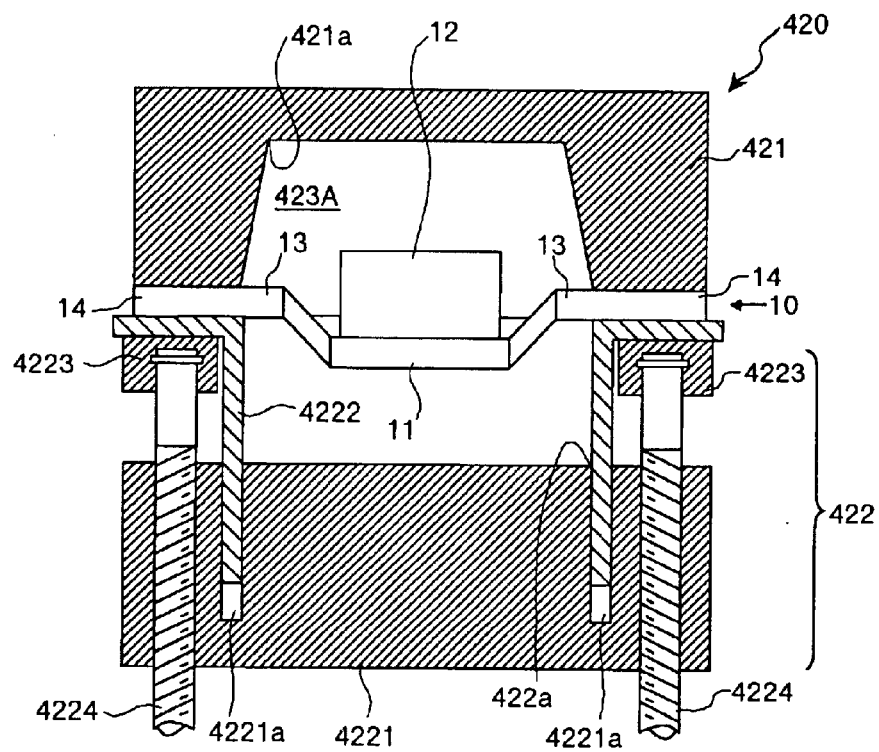
Figure 11B:
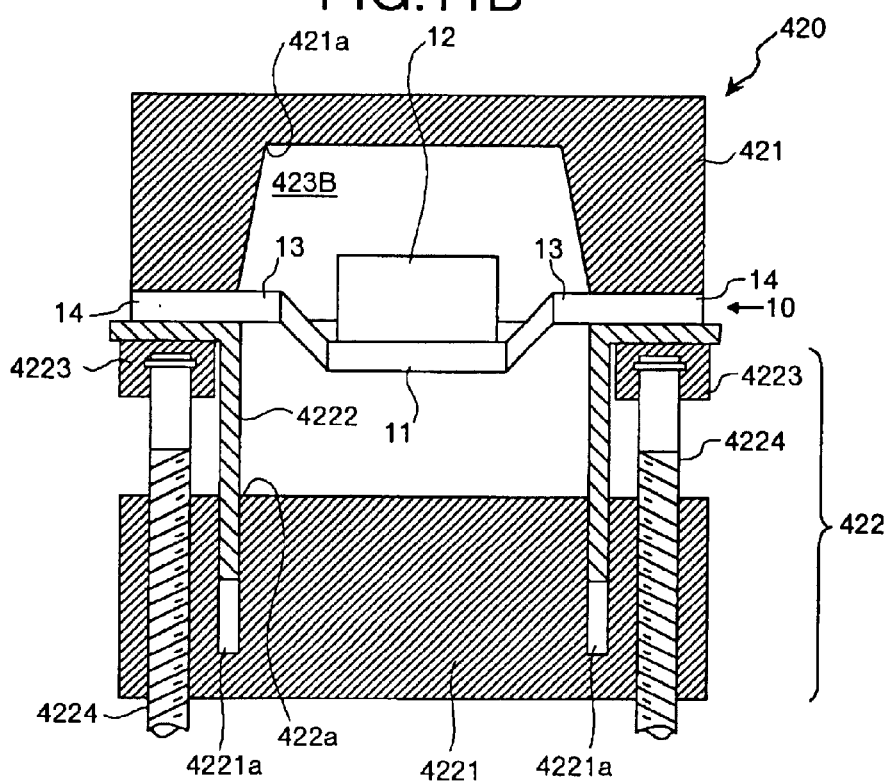

FIG. 11A and FIG. 11B show a resin sealing apparatus according to the sixth embodiment of the present invention. Like in the first embodiment, the resin sealing apparatus of the sixth embodiment is for manufacturing semiconductor devices such as an SOP and a TSOP. The resin sealing apparatus seals a semiconductor chip 12 mounted on a die pad section 11 of a lead frame 10, and an inner bonding portion, with a seal resin. Further, the resin sealing apparatus extends an outer lead 14 of the lead frame 10 to the outside of the sealed resin. The resin sealing apparatus of the sixth embodiment comprises a mold 420.

The mold 420 consists of an upper mold 421 and a lower mold 422 disposed such that they can be opened or closed together. The upper mold 421 and the lower mold 422 are provided with cavity structuring sections 421a and 422a respectively at mutually opposite positions or at one position. The cavity structuring sections 421a and 422a are the portions that constitute a main cavity large enough to accommodate the die pad section 11 on which the semiconductor chip 12 is mounted, the inner lead 13, and the inner bonding portion, on the lead frame 10, when the upper mold 421 and the lower mold 422 are closed together.

Of the mold 420, the upper mold 421 has a structure similar to those of the first to fifth embodiments described above. However, in the sixth embodiment, the lower mold 422 is structured such that the portion of the mold that becomes the peripheral wall of the cavity structuring section 422a can proceed or recede along a height direction. Specifically, a groove 4221a is formed on the upper surface of a reference mold section 4221, and a peripheral mold section 4222 is disposed on this groove 4221a such that the peripheral mold section 4222 can proceed and recede. The upper end portion of the peripheral mold section 4222 is bent at a right angle toward the outside, and the peripheral mold section 4222 is held on a lifting member 4223 via this bent portion. The lifting member 4223 is structured to face the lower surface of the upper mold 421. The lifting member 4223 is installed on the reference mold section 4221 such that the height can be changed via a plurality of height-adjusting bolts 4224.

For carrying out a resin sealing in the resin sealing apparatus having the above-mentioned structure, the height-adjusting bolts 4224 are suitably screwed according to the thickness of a sealed resin of a semiconductor device to be manufactured. Thus, the height of the peripheral mold section 4222 on the reference mold section 4221 is adjusted.

Namely, in the case of manufacturing a semiconductor device having a small thickness of a sealed resin, the height-adjusting bolts 4224 are suitably screwed to move the reference mold section 4221 upward along the height-adjusting bolts 4224. Thus, the lifting member 4223 is brought close to the reference mold section 4221, thereby to set a small stretch height to the peripheral mold section 4222, as shown in FIG. 11A. In this state, the cavity structuring section 422a that is formed between the reference mold section 4221 and the peripheral mold section 4222 has a small height. Consequently, a relatively small main cavity 423A is formed between the upper mold 421 and the lower mold 422. Accordingly, when a molten resin is charged in this state and the molten resin is cured thereafter, it becomes possible to manufacture a semiconductor device having a small thickness of the sealed resin.

On the other hand, in the case of manufacturing a semiconductor device having a larger thickness of a sealed resin than that of the semiconductor device shown in FIG. 11A, the height-adjusting bolts 4224 are suitably screwed to move the reference mold section 4221 downward along the height-adjusting bolts 4224. Thus, the lifting member 4223 is brought far from the reference mold section 4221, thereby to set a large stretch height to the peripheral mold section 4222, as shown in FIG. 11B. In this state, the cavity structuring section 422a that is formed between the reference mold section 4221 and the peripheral mold section 4222 has a large height. Consequently, a relatively large main cavity 423B is formed between the upper mold 421 and the lower mold 422. Accordingly, when a molten resin is charged in this state and the molten resin is cured thereafter, it becomes possible to manufacture a semiconductor device having a large thickness of the sealed resin.

As explained, according to the resin sealing apparatus of the sixth embodiment, it is possible to change the thickness of the sealed resin in accordance with a status of the peripheral mold section 4222 that proceeds to or recedes from the reference mold section 4221. Therefore, it is not necessary to design and manufacture a new mold following a change in the thickness of the sealed resin. Consequently, it becomes possible to promptly respond to the requirement, and it is also possible to prevent an increase in the cost of manufacturing semiconductors. Further, in the case of continuously manufacturing semiconductor devices having mutually different thicknesses, it is not necessary to replace the mold in the preparation work. As a result, it is possible to improve the semiconductor production efficiency.

In the sixth embodiment, only the peripheral mold section 4222 of the lower mold 422 can be expanded or contracted. However, it is also possible to structure such that only the peripheral mold section of the upper mold 421 can be proceeded or receded. Alternatively, both the peripheral mold section 4222 of the lower mold 422 and the peripheral mold section of the upper mold 421 can be proceeded or receded. Further, in the sixth embodiment, when a molten resin has been charged, the charged molten resin may leak out from between the reference mold section 4221 and the lower end portion of the peripheral mold section 4222. In this case, it is preferable to cover the inner-wall surface of the cavity structuring sections 421a and 422a formed between the reference mold section 4221 and the peripheral mold section 4222, with a resin film.

In the first and second embodiments, external sizes and an external shape of a sealed resin are changed by accommodating an external-shape regulating member in the main cavity of the mold. According to a seventh embodiment described in detail below, external sizes and an external shape of a sealed resin are changed by structuring a main cavity based on a provision of a lifting member that can proceed to or recede from a predetermined reference mold section and a disposition of a resin film on the reference mold section and inside the lifting member.

Figure 12A:
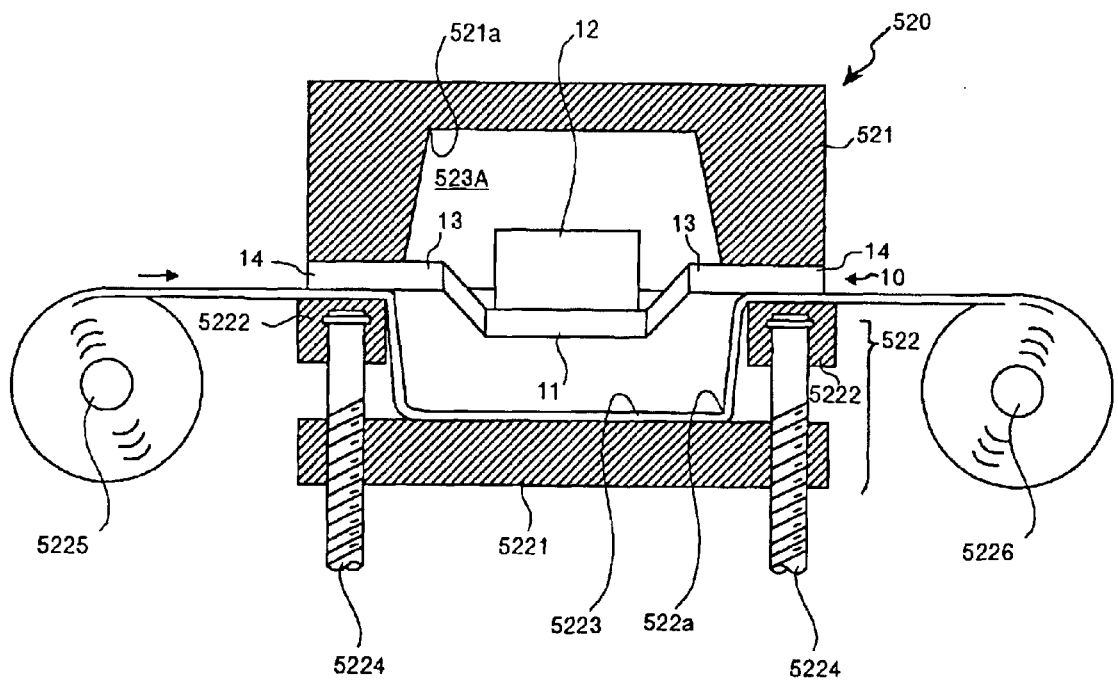
Figure 12B:
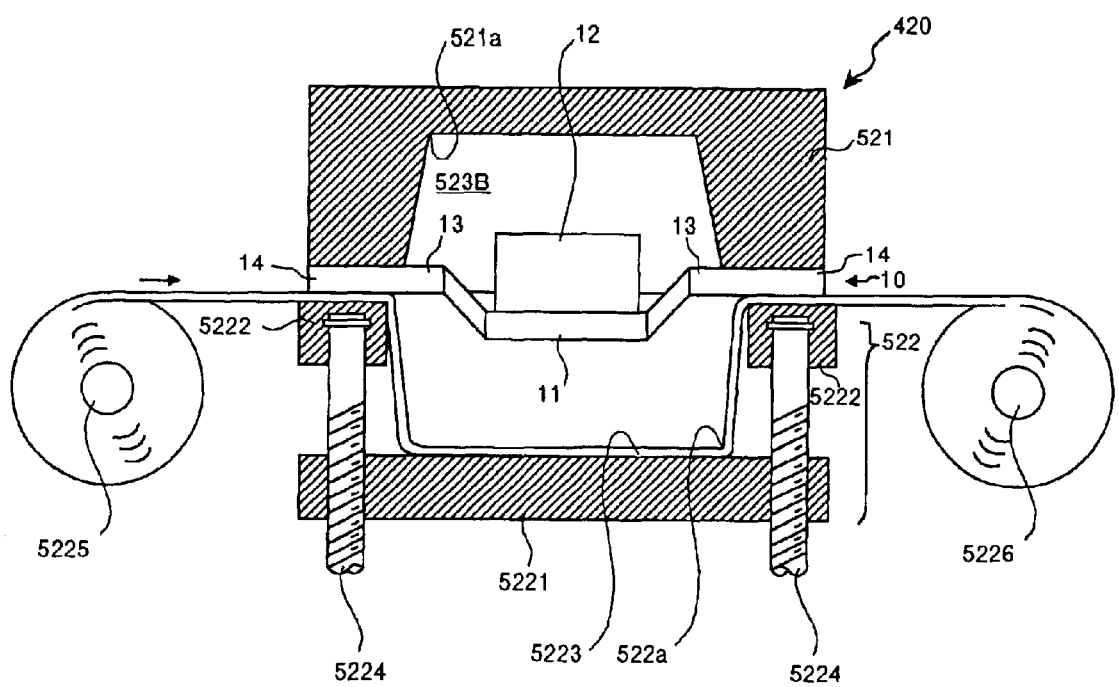
Figure 13A:
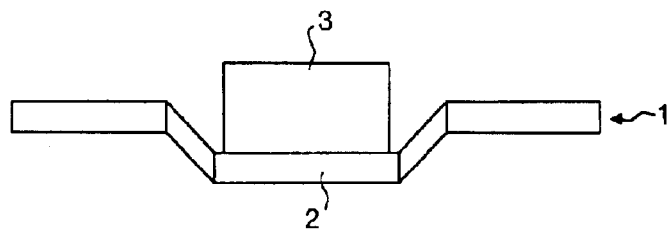
Figure 13B:
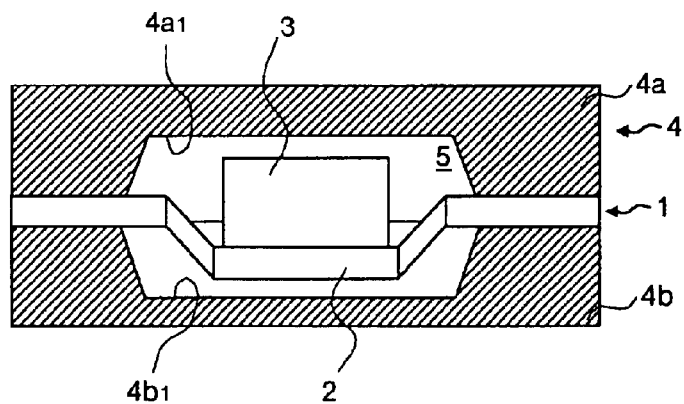
Figure 13C:
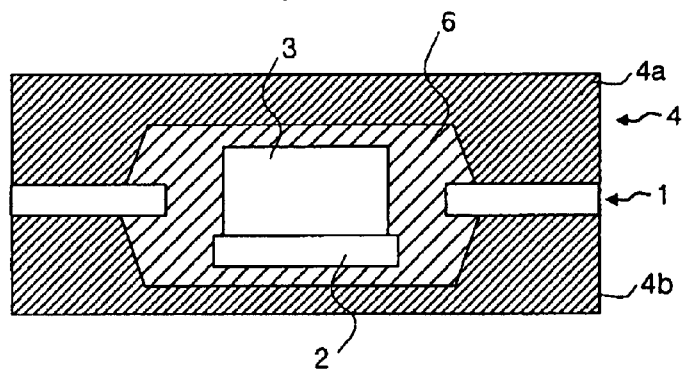
Figure 13D:
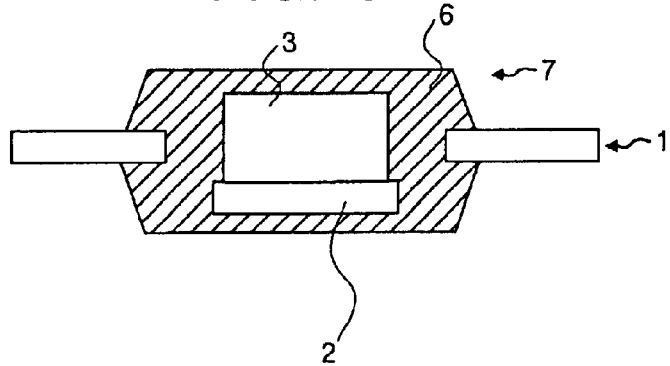
Figure 14A:
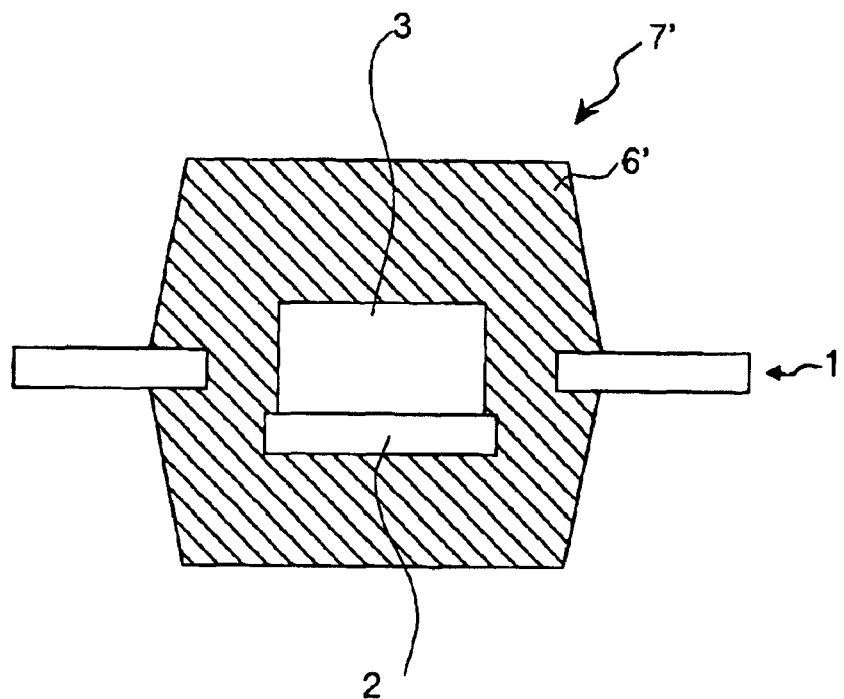
FIG. 14A is a cross-sectional side view of a semiconductor device in a status that a sealed resin has a larger thickness than that shown in FIG. 13D.
Figure 14B:
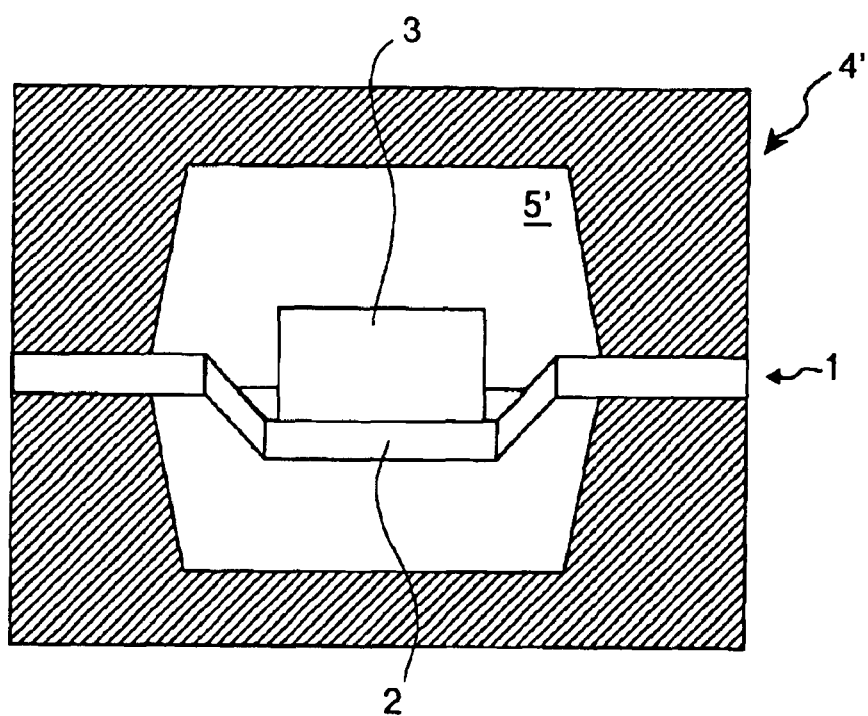
FIG. 14B is a cross-sectional side view of a mold for sealing the semiconductor device shown in FIG. 13A with a resin.

FIG. 12A and FIG. 12B show a resin sealing apparatus according to the seventh embodiment of the present invention. Like in the first embodiment, the resin sealing apparatus of the sixth embodiment is for manufacturing semiconductor devices such as an SOP and a TSOP. The resin sealing apparatus seals a semiconductor chip 12 mounted on a die pad section 11 of a lead frame 10, and an inner bonding portion, with a seal resin. Further, the resin sealing apparatus extends an outer lead 14 of the lead frame 10 to the outside of the sealed resin. The resin sealing apparatus of the sixth embodiment comprises a mold 520.

The mold 520 consists of an upper mold 521 and a lower mold 522 disposed such that they can be opened or closed together. The upper mold 521 and the lower mold 522 are provided with cavity structuring sections 521a and 522a respectively at mutually opposite positions or at one position. The cavity structuring sections 521a and 522a are the portions that constitute a main cavity large enough to accommodate the die pad section 11 on which the semiconductor chip 12 is mounted, the inner lead 13, and the inner bonding portion, on the lead frame 10, when the upper mold 521 and the lower mold 522 are closed together.

Of the mold 520, the upper mold 521 has a structure similar to those of the first to sixth embodiments described above. In the seventh embodiment, the lower mold 522 consists of a reference mold section 5221 that becomes a reference, a lifting member 5222 that can proceed to or recede from the reference mold section 5221 in a height direction, and a resin film 5223 disposed on the reference mold section 5221 and inside the lifting member 5222. The resin film 5223 constitutes the cavity structuring section 522a.

The lifting member 5222 is structured to face the lower surface of the upper mold 521. The lifting member 5222 is installed on the reference mold section 5221 such that the height can be changed via a plurality of height-adjusting bolts 5224. The resin film 5223 is disposed on the reference mold section 5221 and inside the lifting member 5222 while the resin film 5223 is supplied from a spin roller 5225 and is wound around a winding roller 5226. For the resin film 5223, it is preferable to use a film made of a material like polytetrafluoroethylene, for example, that can be satisfactorily exfoliated from the sealed resin.

For carrying out a resin sealing in the resin sealing apparatus having the above-mentioned structure, the height-adjusting bolts 5224 are suitably screwed according to the thickness of a sealed resin of a semiconductor device to be manufactured. Thus, the height of the lifting member 5222 on the reference mold section 5221 is adjusted.

Namely, in the case of manufacturing a semiconductor device having a small thickness of a sealed resin, the height-adjusting bolts 5224 are suitably screwed to move the reference mold section 5221 upward along the height-adjusting bolts 5224. Thus, the lifting member 5222 is brought close to the reference mold section 5221, as shown in FIG. 12A. In this state, the resin film 5223 disposed on the reference mold section 5221 and inside the lifting member 5222 has a small height. Accordingly, the cavity structuring section 522a formed by the resin film 5223 also has a small height. Consequently, a relatively small main cavity 523A is formed between the upper mold 521 and the lower mold 522. As a result, when a molten resin is charged in this state and the molten resin is cured thereafter, it becomes possible to manufacture a semiconductor device having a small thickness of the sealed resin.

On the other hand, in the case of manufacturing a semiconductor device having a larger thickness of a sealed resin than that of the semiconductor device shown in FIG. 12A, the height-adjusting bolts 5224 are suitably screwed to move the reference mold section 5221 downward along the height-adjusting bolts 5224. Thus, the lifting member 5222 is brought far from the reference mold section 5221, as shown in FIG. 12B. In this state, the resin film 5223 disposed on the reference mold section 5221 and inside the lifting member 5222 has a large height. Accordingly, the cavity structuring section 522a formed by the resin film 5223 also has a large height. Consequently, a relatively large main cavity 523A is formed between the upper mold 521 and the lower mold 522. As a result, when a molten resin is charged in this state and the molten resin is cured thereafter, it becomes possible to manufacture a semiconductor device having a large thickness of the sealed resin.

In the-above mentioned process, according to the seventh embodiment, the winding roller 5226 is driven each time when the molten resin is charged and cured. Alternatively, both the spin roller 5225 and the 5226 are driven each time when the molten resin is charged and cured. Thus, the resin film 5223 is replaced. With this arrangement, it is possible to structure a main cavity always with a new resin film 5223. As a result, there is no risk that reformation or deformation of the resin film 5223 attributable to the charge of the molten resin affects the seal resin of the semiconductor device.

As explained, according to the resin sealing apparatus of the seventh embodiment, it is possible to change the thickness of the sealed resin in accordance with a status of the lifting member 5222 that proceeds to or recedes from the reference mold section 5221. Therefore, it is not necessary to design and manufacture a new mold following a change in the thickness of the sealed resin. Consequently, it becomes possible to promptly respond to the requirement, and it is also possible to prevent an increase in the cost of manufacturing semiconductors. Further, in the case of continuously manufacturing semiconductor devices having mutually different thicknesses, it is not necessary to replace the mold in the preparation work. Furthermore, a material that can be satisfactorily exfoliated from the sealed resin is used for the resin film 5223 that constitutes the main cavity. Accordingly, it is possible to release the sealed resin from the mold easily and in a short time. As a result, it is possible to improve the semiconductor production efficiency.

While only the cavity structuring section 522a of the lower mold 522 is structured with the rein film 5223 in the seventh embodiment, it is also possible to structure only the cavity structuring section 521a of the upper mold 521 with the rein film 5223. Further, it is also possible to structure both the cavity structuring section 522a of the lower mold 522 and the cavity structuring section 521a of the upper mold 521 with the rein film 5223. Although film-exchanging unit using the deliver roller 5225 and the winding roller 5226 is provided, it is not always necessary to provide this film-exchanging unit.

As explained above, according to the resin sealing apparatus of one aspect of the present invention, it is possible to change external sizes or an external shape of the sealed resin, by accommodating the external-shape regulating member in the main cavity of the mold. Therefore, it is not necessary to design and manufacture a new mold following a change in the external sizes and external shape of the sealed resin. Consequently, it becomes possible to promptly respond to the requirement, and it is also possible to prevent an increase in the cost of manufacturing the semiconductors. Further, in the case of continuously manufacturing semiconductor devices having mutually different external sizes and external shapes, it is not necessary to replace the mold in the preparation work. As a result, it is possible to improve the semiconductor production efficiency.

Furthermore, it is easy to mount and dismount the external-shape regulating member onto/from the main cavity. Accordingly, it is possible to facilitate the preparation work, and further improve the production efficiency.

Moreover, it is possible to prevent a molten resin from penetrating into a gap between the edges of the external-shape regulating member and the inner-wall surface of the main cavity, at the time of charging the molten resin. Consequently, it is possible to prevent a positional deviation of the external-shape regulating members due to the penetration of the molten resin inside the main cavity, and it is also possible to restrict the occurrence of flash on the sealed resin of the semiconductor device. As a result, it is possible to improve the quality.

Furthermore, the stage provided on the inner-wall surface of the main cavity is securely brought into contact with edges of the external-shape regulating member. Therefore, it is possible to prevent a molten resin from penetrating into a gap between the edges of the external-shape regulating member and the inner-wall surface of the main cavity, at the time of charging the molten resin. Consequently, it is possible to prevent a positional deviation of the external-shape regulating members due to the penetration of the molten resin inside the main cavity, and it is also possible to restrict the occurrence of flash on the sealed resin of the semiconductor device. As a result, it is possible to improve the quality.

Moreover, it is possible to prevent a positional deviation of the external-shape regulating member within the main cavity. As a result, it is possible to improve the semiconductor production efficiency.

Furthermore, it is possible to change external sizes and an external shape of a sealed resin to a plurality of kinds of sizes and shapes, by selecting an external-shape regulating member that is accommodated in the main cavity. As a result, it is possible to further lower the cost of manufacturing semiconductors, and it is also possible to further improve the production efficiency.

According to the resin sealing apparatus of another aspect of the invention, it is possible to change external sizes and an external shape of a sealed resin, by disposing the spacer member between the pair of molds. Therefore, it is not necessary to design and manufacture a new mold following a change in the external sizes and external shape of the sealed resin. Consequently, it becomes possible to promptly respond to the requirement, and it is also possible to prevent an increase in the cost of manufacturing the semiconductors. Further, in the case of continuously manufacturing semiconductor devices having mutually different external sizes and external shapes, it is not necessary to replace the mold in the preparation work. As a result, it is possible to improve the semiconductor production efficiency.

Furthermore, it is possible to change external sizes and an external shape of a sealed resin to a plurality of kinds of sizes and shapes, by selecting a spacer member that is disposed between the pair of molds. As a result, it is possible to further lower the cost of manufacturing semiconductors, and it is also possible to further improve the production efficiency.

According to the resin sealing apparatus of still another aspect of the invention, it is possible to change external sizes and an external shape of a sealed resin, by making the external-shape regulating member proceed to the main cavity. Therefore, it is not necessary to design and manufacture a new mold following a change in the external sizes and external shape of the sealed resin. Consequently, it becomes possible to promptly respond to the requirement, and it is also possible to prevent an increase in the cost of manufacturing the semiconductors. Further, in the case of continuously manufacturing semiconductor devices having mutually different external sizes and external shapes, it is not necessary to replace the mold in the preparation work. As a result, it is possible to improve the semiconductor production efficiency.

Furthermore, based on the supporting work of the supporting unit, it is possible to prevent the occurrence of deformation of the external-shape regulating member like flexure, at the time of charging a molten resin. Therefore, it is possible to obtain external sizes and an external shape of a sealed resin as desired. As a result, it is possible to improve the quality of semiconductor devices.

Moreover, based on the driving of the fluid supply unit, it is possible to prevent the occurrence of deformation of the external-shape regulating member like flexure, at the time of charging a molten resin. Therefore, it is possible to obtain external sizes and an external shape of a sealed resin as desired. As a result, it is possible to improve the quality of semiconductor devices.

Furthermore, it is possible to change external sizes and an external shape of a sealed resin to a plurality of kinds of sizes and shapes, by selecting an external-shape regulating member that proceeds to the main cavity. As a result, it is possible to further lower the cost of manufacturing semiconductors, and it is also possible to further improve the production efficiency.

According to the resin sealing apparatus of still another aspect of the invention, it is possible to change external sizes and an external shape of a sealed resin, by changing the height of the portion of the mold that constitutes the peripheral wall of the main cavity. Therefore, it is not necessary to design and manufacture a new mold following a change in the external sizes and external shape of the sealed resin. Consequently, it becomes possible to promptly respond to the requirement, and it is also possible to prevent an increase in the cost of manufacturing the semiconductors. Further, in the case of continuously manufacturing semiconductor devices having mutually different external sizes and external shapes, it is not necessary to replace the mold in the preparation work. As a result, it is possible to improve the semiconductor production efficiency.

Furthermore, it is possible to change external sizes and an external shape of a sealed resin in accordance with an expanded or contacted status of the portion of the mold. Therefore, it is not necessary to design and manufacture a new mold following a change in the external sizes and external shape of the sealed resin. Consequently, it becomes possible to promptly respond to the requirement, and it is also possible to prevent an increase in the cost of manufacturing the semiconductors. Further, in the case of continuously manufacturing semiconductor devices having mutually different external sizes and external shapes, it is not necessary to replace the mold in the preparation work. As a result, it is possible to improve the semiconductor production efficiency.

Moreover, it is possible to change external sizes and an external shape of a sealed resin in accordance with a proceeding status of the portion of the mold. Therefore, it is not necessary to design and manufacture a new mold following a change in the external sizes and external shape of the sealed resin. Consequently, it becomes possible to promptly respond to the requirement, and it is also possible to prevent an increase in the cost of manufacturing the semiconductors. Further, in the case of continuously manufacturing semiconductor devices having mutually different external sizes and external shapes, it is not necessary to replace the mold in the preparation work. As a result, it is possible to improve the semiconductor production efficiency.

Furthermore, it is possible to change external sizes and an external shape of a sealed resin in accordance with a proceeding status of the lifting member. Therefore, it is not necessary to design and manufacture a new mold following a change in the external sizes and external shape of the sealed resin. Consequently, it becomes possible to promptly respond to the requirement, and it is also possible to prevent an increase in the cost of manufacturing the semiconductors. Further, in the case of continuously manufacturing semiconductor devices having mutually different external sizes and external shapes, it is not necessary to replace the mold in the preparation work. As a result, it is possible to improve the semiconductor production efficiency.

Moreover, it is possible to structure the main cavity always with a new resin film. As a result, it is possible to avoid a risk that reformation or deformation of the resin film attributable to the charge of a molten resin affects the seal resin of a semiconductor device.

Furthermore, it is possible to easily release the sealed resin from the mold after the charged molten resin has been cured. As a result, it is possible to improve the production efficiency.

According to the resin sealing method of still another aspect of the invention, it is possible to change external sizes and an external shape of a sealed resin by selecting whether the external-shape regulating member is to be accommodated in the main cavity of the mold or not. Therefore, it is not necessary to design and manufacture a new mold following a change in the external sizes and external shape of the sealed resin. Consequently, it becomes possible to promptly respond to the requirement, and it is also possible to prevent an increase in the cost of manufacturing the semiconductors. Further, in the case of continuously manufacturing semiconductor devices having mutually different external sizes and external shapes, it is not necessary to replace the mold in the preparation work. As a result, it is possible to improve the semiconductor production efficiency.

According to the resin sealing method of still another aspect of the invention, it is possible to change external sizes and an external shape of a sealed resin depending on a kind of an external-shape regulating member that is accommodated in the main cavity of the mold. Therefore, it is not necessary to design and manufacture a new mold following a change in the external sizes and external shape of the sealed resin. Consequently, it becomes possible to promptly respond to the requirement, and it is also possible to prevent an increase in the cost of manufacturing the semiconductors. Further, in the case of continuously manufacturing semiconductor devices having mutually different external sizes and external shapes, it is not necessary to replace the mold in the preparation work. As a result, it is possible to improve the semiconductor production efficiency.

According to the resin sealing method of still another aspect of the invention, it is possible to change external sizes and an external shape of a sealed resin by selecting whether the spacer member is to be disposed between the pair of molds or not. Therefore, it is not necessary to design and manufacture a new mold following a change in the external sizes and external shape of the sealed resin. Consequently, it becomes possible to promptly respond to the requirement, and it is also possible to prevent an increase in the cost of manufacturing the semiconductors. Further, in the case of continuously manufacturing semiconductor devices having mutually different external sizes and external shapes, it is not necessary to replace the mold in the preparation work. As a result, it is possible to improve the semiconductor production efficiency.

According to the resin sealing method of still another aspect of the invention, it is possible to change external sizes and an external shape of a sealed resin depending on a kind of a spacer member that is disposed between the pair of molds. Therefore, it is not necessary to design and manufacture a new mold following a change in the external sizes and external shape of the sealed resin. Consequently, it becomes possible to promptly respond to the requirement, and it is also possible to prevent an increase in the cost of manufacturing the semiconductors. Further, in the case of continuously manufacturing semiconductor devices having mutually different external sizes and external shapes, it is not necessary to replace the mold in the preparation work. As a result, it is possible to improve the semiconductor production efficiency.

According to the resin sealing method of still another aspect of the invention, it is possible to change external sizes and an external shape of a sealed resin by adjusting the height of the portion of the mold. Therefore, it is not necessary to design and manufacture a new mold following a change in the external sizes and external shape of the sealed resin. Consequently, it becomes possible to promptly respond to the requirement, and it is also possible to prevent an increase in the cost of manufacturing the semiconductors. Further, in the case of continuously manufacturing semiconductor devices having mutually different external sizes and external shapes, it is not necessary to replace the mold in the preparation work. As a result, it is possible to improve the semiconductor production efficiency.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A resin sealing apparatus comprising:

a mold having a main cavity in which a portion of a semiconductor device to be sealed with a resin is disposed; and an external-shape regulating member detachably accommodated in the main cavity of the mold, for forming a new cavity within the main cavity, wherein the mold has inner-wall surfaces which defines a shape of the main cavity, the inner-wall surfaces including a first surface onto which the external-shape regulating member is placed, and a second surface adjacent to the first surface having an angle of more than 90 degrees relative to the first surface, and the external-shape regulating member has a third surface facing the first surface and fourth surface facing the second surface, the fourth surface having an angle of more than 90 degrees relative to the third surface, the angle of the fourth surface being substantially the same as that of the second surface relative to the first surface.

2. The resin sealing apparatus according to claim 1, further comprising a close-contact holding unit which holds the external-shape regulating member accommodated in the main cavity of the mold on the inner-wall surface of the main cavity in close contact with this surface.

3. The resin sealing apparatus according to claim 1, wherein the first surface of the mold has a through-hole which reaches to the main cavity from the outside of the mold, the resin sealing apparatus further comprising suction means for applying suction force to the fourth surface of the external-shape regulating member through the through-hole in order the external-shape regulating member to securely be placed on the first surface of the mold.

4. The resin sealing apparatus according to claim 1, further comprising:

a supporting regulating member detachably accommodated in the main cavity of the mold, for forming the new cavity, cooperating with the external-shape regulation member.

* * * * *